（12） United States Patent
Ikarashi et al.

(10) Patent No.: US 11,004,902 B2
(45) Date of Patent: May 11, 2021

(54) CIRCUIT ELEMENT, STORAGE DEVICE, ELECTRONIC EQUIPMENT, METHOD OF WRITING INFORMATION INTO CIRCUIT ELEMENT, AND METHOD OF READING INFORMATION FROM CIRCUIT ELEMENT

(71) Applicant: SONY CORPORATION, Tokyo (JP)

(72) Inventors: Minoru Ikarashi, Kanagawa (JP); Seiji Nonoguchi, Kanagawa (JP); Takeyuki Sone, Kanagawa (JP); Hiroaki Sei, Kanagawa (JP); Kazuhiro Ohba, Tokyo (JP); Jun Okuno, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 131 days.

(21) Appl. No.: 16/306,033

(22) PCT Filed: Apr. 24, 2017

(86) PCT No.: PCT/JP2017/016239
§ 371 (c)(1),
(2) Date: Nov. 30, 2018

(87) PCT Pub. No.: WO2017/217119
PCT Pub. Date: Dec. 21, 2017

(65) Prior Publication Data
US 2019/0296083 A1 Sep. 26, 2019

(30) Foreign Application Priority Data
Jun. 14, 2016 (JP) .............................. JP2016-118255

(51) Int. Cl.
*G11C 13/00* (2006.01)
*H01L 27/24* (2006.01)
(Continued)

(52) U.S. Cl.
CPC ...... *H01L 27/2436* (2013.01); *G11C 13/0004* (2013.01); *G11C 13/004* (2013.01);
(Continued)

(58) Field of Classification Search
CPC .............. G11C 13/0004; G11C 13/004; G11C 13/0069
See application file for complete search history.

(56) References Cited

U.S. PATENT DOCUMENTS 9,281,473 B1\* 3/2016 Suzuki .................. H01L 45/145
2005/0286211 A1\* 12/2005 Pinnow ............... G11C 13/0011
361/523
(Continued)

FOREIGN PATENT DOCUMENTS

CN 101427396 A 5/2009
JP 2008-135659 A 6/2008
(Continued)

OTHER PUBLICATIONS

International Search Report and Written Opinion of PCT Application No. PCT/JP2017/016239, dated Jun. 27, 2017, 02 pages of translation and 13 pages of ISRWO.

*Primary Examiner* — Han Yang
(74) *Attorney, Agent, or Firm* — Chip Law Group

(57) ABSTRACT

Provided is a circuit element that includes paired inert electrodes, and a switch layer provided between the paired inert electrodes, that functions as a selection element and a storage element as a single layer, and having a differential negative resistance region in a current-voltage characteristic.

17 Claims, 16 Drawing Sheets

(51) Int. Cl.
*H01L 45/00* (2006.01)
*H01L 27/105* (2006.01)
*H01L 49/00* (2006.01)
*H01L 21/8239* (2006.01)

(52) U.S. Cl.
CPC ...... *G11C 13/0069* (2013.01); *H01L 21/8239* (2013.01); *H01L 27/105* (2013.01); *H01L 27/2463* (2013.01); *H01L 45/00* (2013.01); *H01L 45/06* (2013.01); *H01L 45/126* (2013.01); *H01L 45/141* (2013.01); *H01L 49/00* (2013.01); *G11C 2013/0078* (2013.01); *G11C 2213/15* (2013.01)

(56) References Cited

U.S. PATENT DOCUMENTS

| | | | |
|---|---|---|---|
| 2007/0034849 A1 | 2/2007 | Sandoval et al. | |
| 2007/0034850 A1 | 2/2007 | Kostylev et al. | |
| 2007/0034851 A1 | 2/2007 | Kostylev et al. | |
| 2007/0247899 A1* | 10/2007 | Gordon | G11C 13/0004 365/163 |
| 2008/0042119 A1 | 2/2008 | Sandoval et al. | |
| 2008/0048167 A1 | 2/2008 | Kostylev et al. | |
| 2008/0273372 A1 | 11/2008 | Sandoval et al. | |
| 2008/0273379 A1 | 11/2008 | Gordon et al. | |
| 2010/0321991 A1 | 12/2010 | Kostylev et al. | |
| 2013/0300509 A1* | 11/2013 | Kim | H03L 7/00 331/34 |
| 2014/0034893 A1 | 2/2014 | Nakabayashi et al. | |
| 2015/0207066 A1 | 7/2015 | Ohba et al. | |
| 2016/0336378 A1 | 11/2016 | Ohba et al. | |
| 2016/0351622 A1* | 12/2016 | Gibson | H01L 27/2418 |
| 2017/0098683 A1 | 4/2017 | Ohba et al. | |
| 2017/0098684 A1 | 4/2017 | Ohba et al. | |

FOREIGN PATENT DOCUMENTS

| | | |
|---|---|---|
| JP | 2009-524210 A | 6/2009 |
| JP | 2009-534835 A | 9/2009 |
| JP | 2010-531062 A | 9/2010 |
| JP | 2013-179311 A | 9/2013 |
| JP | 2014-033041 A | 2/2014 |
| JP | 5520484 B2 | 6/2014 |
| JP | 2015-135917 A | 7/2015 |
| WO | 2007/127014 A2 | 11/2007 |
| WO | 2015/107945 A1 | 7/2015 |
| WO | 2016/052097 A1 | 4/2016 |

* cited by examiner

CIRCUIT ELEMENT, STORAGE DEVICE, ELECTRONIC EQUIPMENT, METHOD OF WRITING INFORMATION INTO CIRCUIT ELEMENT, AND METHOD OF READING INFORMATION FROM CIRCUIT ELEMENT

CROSS REFERENCE TO RELATED APPLICATIONS

This application is a U.S. National Phase of International Patent Application No. PCT/JP2017/016239 filed on Apr. 24, 2017, which claims priority benefit of Japanese Patent Application No. JP 2016-118255 filed in the Japan Patent Office on Jun. 14, 2016. Each of the above-referenced applications is hereby incorporated herein by reference in its entirety.

TECHNICAL FIELD

The present disclosure relates to a circuit element, a storage device, electronic equipment, a method of writing information into a circuit element, and a method of reading information from a circuit element.

BACKGROUND ART

In recent years, a further increase in capacity has been required for nonvolatile memories used for a data storage and the like.

In order to achieve an increase in capacity of nonvolatile memories, a "cross point type memory cell array" structure in which memory cells which are unit elements that store data are miniaturized, and a larger number of them are tessellated on the substrate surface, a "stacked type memory cell array" structure in which a plurality of memory cells are stacked in a direction perpendicular to the substrate surface, or the like has been proposed, for example.

In addition, in the "cross point type memory cell array" structure, of a storage element and a selection element included in a memory cell, an attempt to further miniaturize the memory cell is being studied by omitting the selection element.

For example, Patent Literature 1 below discloses a cross point memory including a p-i-n type semiconductor diode having a vertical orientation arranged between conductors and not including a selection element. The cross point memory disclosed in Patent Literature 1 alters characteristics of the semiconductor diode by applying a programming voltage to store information.

CITATION LIST

Patent Literature

Patent Literature 1: JP 2008-546213T

DISCLOSURE OF INVENTION

Technical Problem

In the cross point memory disclosed in Patent Literature 1, however, characteristics of the semiconductor diode are permanently altered by applying a programming voltage. Therefore, the cross point memory disclosed in Patent Literature 1 is a so-called write-once type memory into which information can be written only once.

In addition, in the cross point memory, a sneak current that bypasses a selected memory cell and flows into an unselected memory cell is likely to occur since the likelihood that a current flows into a memory cell is increased significantly by alteration of characteristics of the semiconductor diode. Consequently, in the cross point memory disclosed in Patent Literature 1, it is difficult to perform correct information writing and reading into/from a memory cell.

Thus, the present disclosure proposes a circuit element, a storage device, electronic equipment, a method of writing information into a circuit element, and a method of reading information from a circuit element being novel and improved that enable still higher integration for an increase in capacity and suppress occurrence of a sneak current.

Solution to Problem

According to the present disclosure, there is provided a circuit element including: paired inert electrodes; and a switch layer provided between the paired inert electrodes, configured to function as a selection element and a storage element as a single layer, and having a differential negative resistance region in a current-voltage characteristic.

In addition, according to the present disclosure, there is provided a storage device including: a plurality of circuit elements arranged in a matrix, each of the plurality of circuit elements including paired inert electrodes, and a switch layer provided between the paired inert electrodes, configured to function as a selection element and a storage element as a single layer, and having a differential negative resistance region in a current-voltage characteristic.

In addition, according to the present disclosure, there is provided electronic equipment including: a circuit element including paired inert electrodes, and a switch layer provided between the paired inert electrodes, configured to function as a selection element and a storage element as a single layer, and having a differential negative resistance region in a current-voltage characteristic.

In addition, according to the present disclosure, there is provided a method of writing information into a circuit element, the method including: applying a voltage of more than or equal to a threshold value to the circuit element to change the circuit element to an on-state; and controlling a peak current value flowing into the circuit element in the on-state and controlling a resistance value of the circuit element in an off-state to any of a plurality of states to write information into the circuit element. The circuit element includes paired inert electrodes, and a switch layer provided between the paired inert electrodes, configured to function as a selection element and a storage element as a single layer, and having a differential negative resistance region in a current-voltage characteristic.

There is provided a method of writing information into a circuit element, the method including: applying a voltage of more than or equal to a threshold value to the circuit element to change the circuit element to an on-state; and controlling a polarity of the voltage applied to the circuit element in the on-state and controlling a resistance value of the circuit element in an off-state to any of a plurality of states to write information into the circuit element. The circuit element includes paired inert electrodes, and a switch layer provided between the paired inert electrodes, configured to function as a selection element and a storage element as a single layer, and having a differential negative resistance region in a current-voltage characteristic.

In addition, according to the present disclosure, there is provided a method of reading information from a circuit element, the method including: measuring a leak current in the circuit element in an off-state or a threshold voltage that changes the circuit element to an on-state; and determining in which of a plurality of states a resistance value of the circuit element in the off-state is on a basis of the measured leak current or the measured threshold voltage to read information from the circuit element. The circuit element includes paired inert electrodes, and a switch layer provided between the paired inert electrodes, configured to function as a selection element and a storage element as a single layer, and having a differential negative resistance region in a current-voltage characteristic.

Since the circuit element according to the present disclosure can exert the functions of a storage element and a selection element with a single-layer switch layer, it is possible to form a memory cell array that stores compiled information with a smaller film thickness. In addition, since the circuit element according to the present disclosure also functions as a selection element, it is possible to suppress occurrence of a sneak current when writing or reading information.

Advantageous Effects of Invention

According to the present disclosure as described above, it is possible to provide a nonvolatile memory that enables still higher integration and suppresses occurrence of a sneak current.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
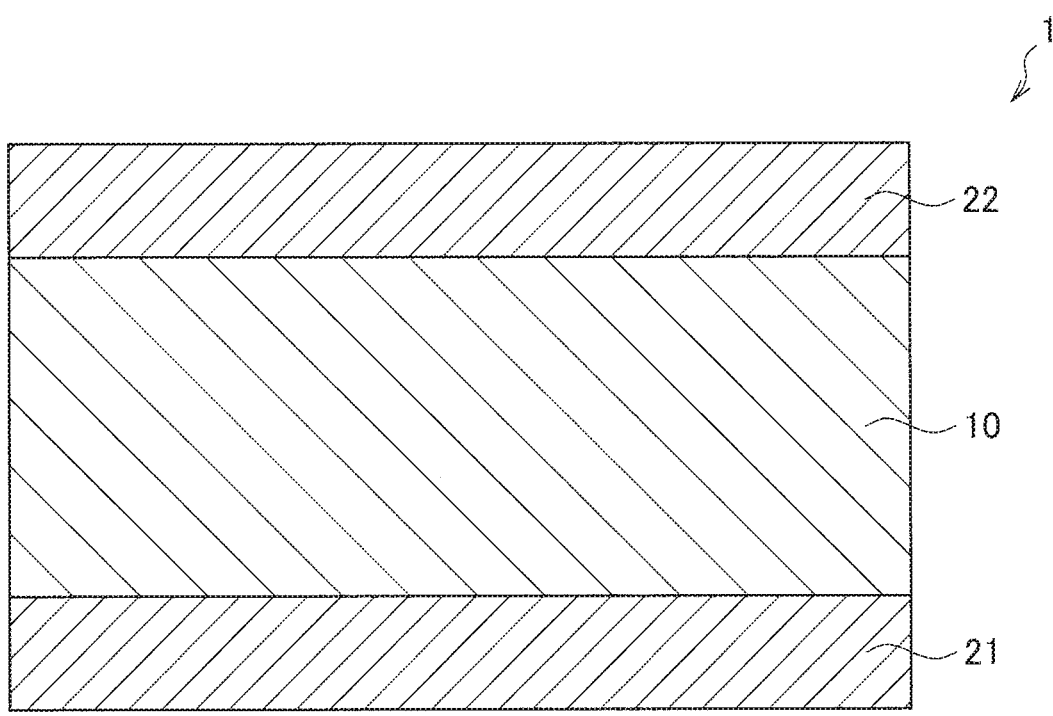
FIG. 1 is a cross sectional view of a stacking direction describing a configuration of a circuit element according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. Configuration of circuit element
2. Current-voltage characteristics of circuit element
2.1. Control over off-state in accordance with peak current value
2.2. Control over off-state in accordance with polarity of applied voltage
3. First operation method for circuit element
3.1. Writing method in first operation method
3.2. Reading method in first operation method
4. First operation method for circuit element
4.1. Writing method in second operation method
4.2. Reading method in second operation method
4.3. Variation
5. Conclusion 1. Configuration of Circuit Element First, an overview of a circuit element according to an embodiment of the present disclosure will be described. The circuit element according to the present embodiment is an element having a differential negative resistance region in current-voltage characteristics, and functioning as a selection element and a storage element.

Specifically, the circuit element according to the present embodiment has an electric property that, when a voltage pulse or current pulse higher than or equal to a threshold value is applied, abruptly transitions from a state (also referred to as an on-state) in which the resistance value is high to a state (also referred to as an off-state) in which the resistance value is low. However, the circuit element according to the present embodiment is volatile in the "on-state", and returns to the "off-state" in the case where electric power is no longer supplied. Consequently, the circuit element according to the present embodiment can function as a selection element capable of changing (also referred to as switching) between the "off-state" in which the resistance value is high and the "on-state" in which the resistance value is low in accordance with whether or not a voltage pulse or current pulse higher than or equal to a threshold value is applied.

In addition, since the circuit element according to the present embodiment has a differential negative resistance region in the current-voltage characteristics, the electric property in the "off-state" splits into at least two or more values on the basis of the state of a voltage and current applied in the "on-state". Specifically, in the circuit element according to the present embodiment, the magnitude of the resistance value in the "off-state" may split into at least two or more values (that is, multiple values) in accordance with the magnitude of the current value flown in the "on-state". In addition, in the circuit element according to the present embodiment, the magnitude of the resistance value in the "off-state" may split into at least two or more values (that is, multiple values) in accordance with the polarity of the voltage applied in the "on-state". Accordingly, in the circuit element, the threshold value of a voltage pulse or current pulse for changing the "off-state" to the "on-state" and the magnitude of a leak current in the "off-state" also split into at least two or more values. Consequently, the circuit element according to the present embodiment can store information by causing a logical value of "0" or "1" to correspond to the "off-state" split into at least two or more values, and can therefore function as a storage element.

Consequently, the circuit element according to the present embodiment is a selection element that also functions as a storage element, and can therefore be formed in a simpler and thinner structure without providing another storage element. Consequently, still higher integration of the circuit element according to the present embodiment can be achieved, and it is therefore possible to increase the capacity of a storage device in which the circuit elements have been integrated.

In addition, since the circuit element according to the present embodiment is a storage element that also functions as a selection element, it is possible to selectively control a current value flowing into the circuit element without providing another selection element. Consequently, the circuit element according to the present embodiment is capable of suppressing occurrence of a sneak current that bypasses a selected circuit element and flows into an unselected circuit element.

Next, a configuration of a circuit element according to an embodiment of the present disclosure will be described with reference to FIG. 1 and FIG. 2. FIG. 1 is a cross sectional view of a stacking direction describing a configuration of the circuit element according to the present embodiment.

As shown in FIG. 1, a circuit element 1 according to the present embodiment includes paired inert electrodes 21 and 22, and a switch layer 10 having a differential negative resistance region in current-voltage characteristics.

The switch layer 10 is provided between the paired inert electrodes 21 and 22, and functions as a selection element and a storage element.

Specifically, the switch layer 10 transitions to the "on-state" in which the resistance value is low when a voltage higher than or equal to a threshold value is applied, and transitions (also referred to as switches) to the "off-state" in which the resistance value is high when the applied voltage is removed. That is, the switch layer 10 functions as a selection element whose resistance value is controlled by applying a voltage higher than or equal to the threshold value. The selection element including such a switch layer 10 is also called an Ovonic Threshold Switch (OTS), for example.

In addition, since the switch layer 10 has a differential negative resistance region in the current-voltage characteristics, the electric property in the "off-state" splits into at least two or more values in accordance with the magnitude and direction of a current flown in the "on-state", the electric property in the "off-state" splits into at least two or more values. Specifically, in the switch layer 10, the resistance value in the "off-state" splits into at least two or more values in accordance with the magnitude and direction of the current flown in the "on-state". This is considered because a formed state of a conduction path formed in the switch layer 10 changes in accordance with the magnitude and direction of the current flown in the "on-state", and the electric property of the switch layer 10 in the "off-state" also changes in accordance with the formed state of the conduction path. Consequently, the switch layer 10 can function as a storage element that stores information in accordance with the "off-state" split into at least two or more.

The switch layer 10 having such an electric property can include a material specifically containing at least one or more kinds of chalcogen elements selected from the group consisting of Te (tellurium), Se (selenium), and S (sulfur). For example, the switch layer 10 may include a composite (so-called chalcogenide) of the above-described chalcogen element and an element lower in electronegativity than the chalcogen element. When the switch layer 10 includes a material containing the chalcogen element, a differential negative resistance region occurs stably in the current-voltage characteristics. In addition, when the switch layer 10 includes a material containing more chalcogen elements, it is possible to lower a threshold voltage in switching.

In addition, the material included in the switch layer 10 may further contain at least one or more kinds of first additional elements selected from the group consisting of B (boron), Al (aluminum), Ga (gallium), C (carbon), Ge (germanium), and Si (silicon). When the switch layer 10 includes the material containing the above-described first additional element, the "off-state" can be split more reliably into at least two or more mutually-stable states. This is because, by adding an element whose atomic radius is relatively small to an element whose atomic radius is relatively large to increase the difference between the atomic radii of the structural elements, a stabilized amorphous structure is likely to occur, and a plurality of stable states are likely to occur in the amorphous structure.

For example, as the first additional element contained in the material included in the switch layer 10, B and C are more preferable. When B and C are contained in the material included in the switch layer 10, the resistance value of the switch layer 10 in the "off-state" increases. In addition, since B and C have small atomic radii as compared with the chalcogen element, when they are contained in the material included in the switch layer 10, it is possible to make the amorphous structure of the switch layer 10 more stable. Specifically, the switch layer 10 may include a material containing Te having a relatively large atomic radius and B having a relatively small atomic radius.

In addition, the material included in the switch layer 10 may further contain at least one or more kinds of second additional elements selected from the group consisting of O and N. When the switch layer 10 includes a material containing the above-described second additional element, it is possible to further increase the resistance value of the switch layer 10 in the "off-state". Accordingly, in the switch layer 10, it is possible to reduce a leak current in the "off-state", and to reduce a current value flowing in switching.

Note that the switch layer 10 may further include a material containing elements other than the foregoing. For example, the switch layer 10 may include a material further containing an alkaline-earth metal such as Mg, Zn, Ca, and Sr or a rare-earth element such as yttrium and lanthanoid.

In order to stably split the electric property in the "off-state" into two or more values, the film thickness of the switch layer 10 may be more than or equal to 5 nm, and preferably more than or equal to 15 nm. In addition, the upper limit of the film thickness of the switch layer 10 is not particularly limited, but considering controllability of the grain boundary through deposition and a threshold value of a switching voltage that increases in proportion to the film thickness, the upper limit of the film thickness of the switch layer 10 may be, for example, 100 nm, and preferably may be 50 nm.

The paired inert electrodes 21 and 22 are provided one upon the other in the stacking direction with the switch layer 10 sandwiched between the inert electrodes 21 and 22. In addition, the inert electrodes 21 and 22 may include a material containing at least one or more kinds of high-melting elements selected from the group consisting of Ti (titanium), W (tungsten), Ta (tantalum), and Si (silicon). Specifically, the inert electrodes 21 and 22 may include a simple substance including the above-described high-melting element, or an alloy, a nitride, or an oxide containing the high-melting element. For example, the inert electrodes 21 and 22 may include TiN, TaN, W, WN, TiW, TiWN, or the like.

In addition, the inert electrodes 21 and 22 may include a material containing at least one or more kinds of elements selected from the group consisting of Ti, W, and Ta. For example, in the case where the switch layer 10 and Al (aluminum), Cu (copper), or the like generally used for an electrode material or interconnection material come into contact, the chalcogen element contained in the switch layer 10 and Al or Cu react or are alloyed, so that the property of the switch layer 10 may be degraded. Therefore, when the inert electrodes 21 and 22 include a material containing at least any of Ti, W, and Ta which are (so-called high barrier property) elements in which diffusion of atoms due to ion conduction or thermal diffusion from a contacting layer is unlikely to occur, it is possible to prevent diffusion of Al or Cu from an interconnection wire or the like into the switch layer 10.

Further, the inert electrodes 21 and 22 may include a material containing W. Besides being an element having a high barrier property, W is an inert element that is unlikely to react or be alloyed with the chalcogen element contained in the switch layer 10. Consequently, when at least one of the paired inert electrodes 21 or 22 includes W alone or an alloy, a nitride, or an oxide containing W, it is possible to prevent reaction or alloying between the inert electrodes 21 and 22 and the switch layer 10 to prevent degradation of the property of the switch layer 10.

Note that the paired inert electrodes 21 and 22 may be formed as a single layer, or may be formed as a plurality of layers. In the case where the inert electrodes 21 and 22 are formed as a plurality of layers, it is preferable that a layer in contact with the switch layer 10 includes W alone or an alloy, a nitride, or an oxide containing W.

In addition, the paired inert electrodes 21 and 22 may include the same material, or may include materials different from each other. Further, it is needless to say that the paired inert electrodes 21 and 22 may be formed in the same layer structure, or may be formed in different layer structures.

However, in the case of controlling the resistance value of the switch layer 10 in the "off-state" in accordance with the polarity of a voltage applied to the switch layer 10 when in the "on-state" (that is, the direction of a current flowing into the switch layer 10), it is preferable that the paired inert electrodes 21 and 22 are formed to be asymmetrical to each other. Specifically, the paired inert electrodes 21 and 22 may be formed such that electric properties become asymmetrical to each other. For example, the paired inert electrodes 21 and 22 may be formed to have mutually different materials, shapes, or interface states or contact areas with the switch layer 10 by varying deposition materials, deposition conditions or etching conditions from each other.

In such a case, since the paired inert electrodes 21 and 22 become different from each other in the contact resistance with the switch layer 10 and the like, the state of a conduction path formed when the switch layer 10 is brought into the "on-state" becomes different from each other. Consequently, since the paired inert electrodes 21 and 22 become different from each other in the propagation path of thermal energy produced by a current flowing in the conduction path, the state of the switch layer 10 in the "off-state" becomes different. Hence, the paired inert electrodes 21 and 22 are formed to be asymmetrical to each other, and it is therefore possible to split the resistance value of the switch layer 10 in the "off-state". Note that, in order to further increase the split width of the resistance value of the switch layer 10 in the "off-state", it is preferable to further increase asymmetry between the paired inert electrodes 21 and 22 from each other.

Since the circuit element 1 including the above-described configuration functions as a selection element and a storage element with the single-layer switch layer 10, the circuit element 1 can function as a storage element with a reduced sneak current without being connected in series with another storage element or selection element.

That is, the circuit element 1 has the "off-state" split into different electric properties of at least two or more values, and is capable of storing information by causing a logical value such as "0" or "1" to correspond to each of the split "off-states". Consequently, the circuit element 1 according to the present embodiment is capable of storing information without connecting a storage element in series.

In addition, since the circuit element 1 in the "off-state" has a higher resistance than a circuit element in the "on-state", it is possible to suppress a sneak current that bypasses a selected circuit element 1 in the "on-state" and flows into an unselected circuit element 1 in the "off-state". Consequently, the circuit element 1 according to the present embodiment is capable of suppressing a sneak current without connecting a selection element in series.

Further, in the circuit element 1 according to the present embodiment, another electrode is not provided between the paired inert electrodes 21 and 22. Here, the electrode even includes an intermediate electrode for coupling different elements to each other while electrically, thermally, or chemically separating them, in addition to an electrode in which interconnection wires electrically connecting to an external circuit are routed. Since the circuit element 1 is not connected in series to another storage element or selection element, there is no need to provide an intermediate electrode for coupling different elements to each other between the paired inert electrodes 21 and 22.

With the circuit element 1 according to the present embodiment, a memory cell which is a unit element that stores data can be configured in a simpler and miniaturized structure. Consequently, since the integration density of memory cells can be improved with the circuit element 1 according to the present embodiment, a memory cell array (that is, a storage device) further increased in capacity can be formed.

Note that, in the circuit element 1 according to the present embodiment, another layer may be provided between the paired inert electrodes 21 and 22 unless the layer has the function of a selection element, storage element, or the like. For example, an insulation layer, a semiconductor layer, or the like may be provided between the paired inert electrodes 21 and 22 in order to adjust the electric property of the circuit element 1.

Next, with reference to FIG. 2, a configuration of a storage device in which the circuit elements according to the present embodiment are arranged in a matrix will be described. FIG. 2 is a perspective view describing a configuration of a storage device in which the circuit elements 1 according to the present embodiment are arranged in a matrix. Note that the storage device represents a memory cell array or memory chip in which a large number of memory cells (equivalent to the circuit elements according to the present embodiment) which are unit elements that store data are arranged in a line or in a matrix.

Figure 2:
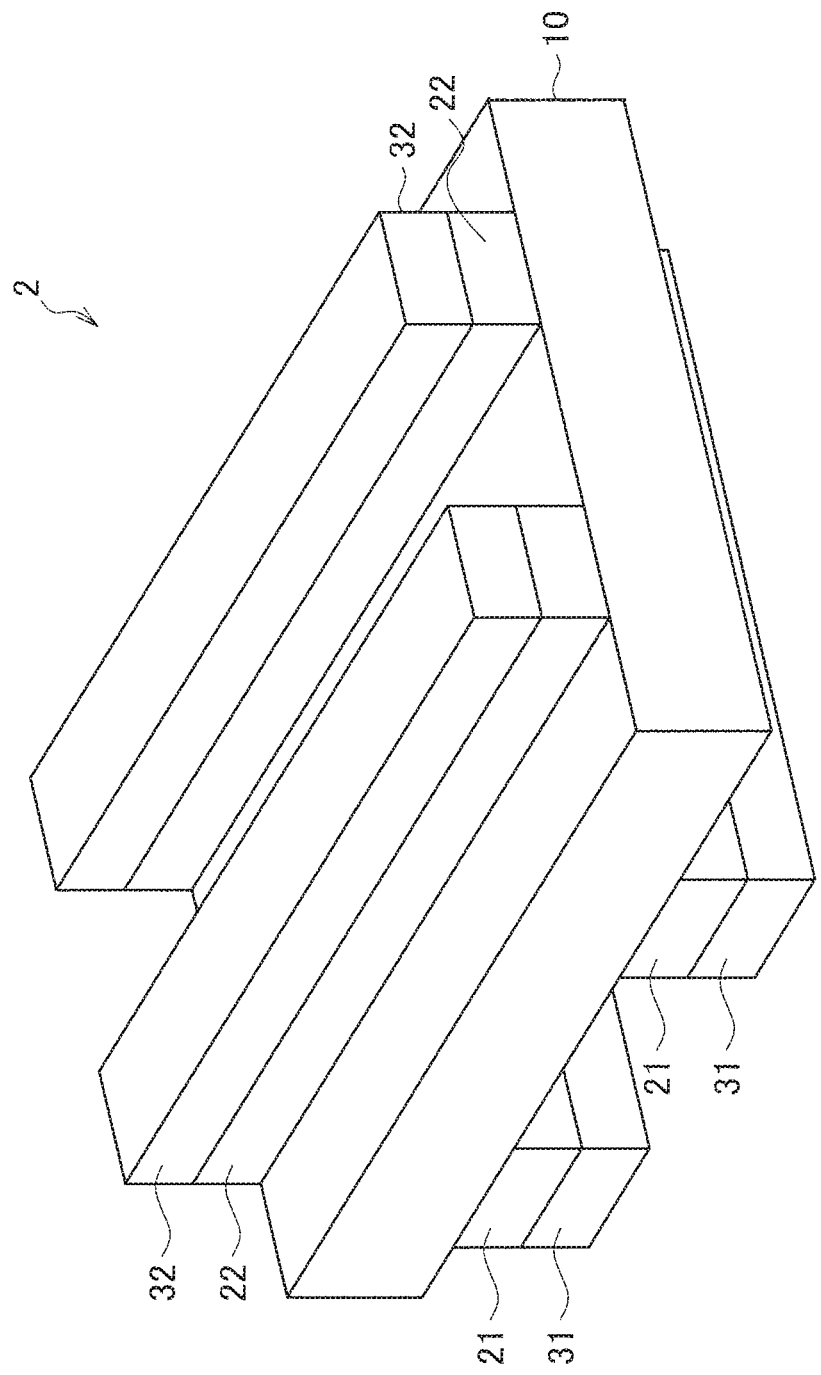
FIG. 2 is a perspective view describing a configuration of a storage device in which the circuit elements according to the embodiment are arranged in a matrix.

As shown in FIG. 2, a storage device 2 according to the present embodiment includes a word line 31 and a bit line 32 that intersect with each other, the inert electrodes 21 and 22 sandwiched between the word line 31 and the bit line 32, and the switch layer 10.

The word line 31 and the bit line 32 are provided so as to sandwich the switch layer 10 with interposition of the inert electrodes 21 and 22 and to intersect with each other. In addition, the word line 31 and the bit line 32 connect to a sense amplifier, an address decoder, and a writing circuit, a deletion circuit, and a reading circuit at extended positions. The word line 31 and the bit line 32 can include a well-known general interconnection material, and may include a metallic material such as Al, Cu, or TiN, for example.

At the intersection point of the word line 31 and the bit line 32, the circuit element 1 including, for example, the inert electrodes 21, 22 and the switch layer 10 and functioning as a selection element and a storage element is formed. That is, the storage device 2 according to the present embodiment is a cross point type memory cell array in which the circuit element 1 that functions as a selection element and a storage element is arranged at the intersection point between intersecting interconnection wires.

The inert electrodes 21 and 22 include the material described above, and are provided between the word line 31 and the bit line 32, and the switch layer 10. Since the inert electrodes 21 and 22 can suppress a reaction or alloying between a metallic material that forms the word line 31 and the bit line 32 and the material that forms the switch layer 10, degradation in property of the switch layer 10 can be suppressed.

The switch layer 10 includes the material described above, and is provided at the intersection point of the word line 31 and the bit line 32.

For example, the switch layer 10 may be provided as a continuous layer in which the respective switch layers 10 of the circuit elements 1 are not spaced apart from one another, as shown in FIG. 2. This is because the insulation property of each of the circuit elements 1 is maintained even if the switch layers 10 are continuous since the conduction path formed in the switch layer 10 in the "on-state" is locally formed in a region of the switch layer 10 sandwiched between the inert electrodes 21 and 22. Therefore, even if the switch layers 10 are not spaced apart for the respective circuit elements 1, the conduction paths formed in the switch layers 10 are electrically spaced apart for the respective circuit elements 1 if the inert electrodes 21 and 22 are spaced apart for the respective circuit elements 1. Consequently, the switch layers 10 do not need to be spaced apart for the respective circuit elements 1, but may be provided as a continuous layer.

In the case where the switch layers 10 are provided as a continuous layer, the storage device 2 can be manufactured more efficiently since a patterning step for separating the switch layers 10 for the respective circuit elements 1 can be omitted. In addition, in the case of stacking the circuit elements 1 further in the deposition direction to obtain a stacked type memory cell array, the storage device 2 can be manufactured more efficiently since the patterning step can be omitted in each of the switch layers 10 to be stacked.

Note that it is needless to say that the switch layers 10 may be patterned such that the switch layers 10 of the respective circuit elements 1 are spaced apart and may be provided only at the intersection point of the word line 31 and the bit line 32. Accordingly, the insulation property of the switch layer 10 in each of the circuit elements 1 can be improved.

Here, the circuit element 1 and the storage device 2 shown in FIG. 1 and FIG. 2 can be manufactured by selecting various well-known vacuum deposition methods on the basis of the deposition material. For example, the circuit element 1 and the storage device 2 can be manufactured by depositing each layer using a chemical vapor deposition (CVD) method or sputtering method and patterning using a photolithography method and an etching method.

2. Current-Voltage Characteristics of Circuit Element

Next, current-voltage characteristics of the circuit element 1 according to the present embodiment will be described with reference to FIG. 3 to FIG. 6.

Hereinafter, as an example of the circuit element 1 according to the present embodiment, the circuit element 1 through use of the switch layer 10 including a chalcogenide material containing 40 atomic percent B, 13 atomic percent C, 17 atomic percent Te, and 30 atomic percent N and having a film thickness of 30 nm will be illustrated, and current-voltage characteristics that the circuit element 1 includes will be described. Note that the circuit element 1 is sandwiched between the inert electrode 21 including W and the inert electrode 22 including TiN, and as the size of the circuit element 1, a circle having a diameter of 100 nm is adopted.

2.1. Control Over Off-State in Accordance with Peak Current Value

Figure 3:
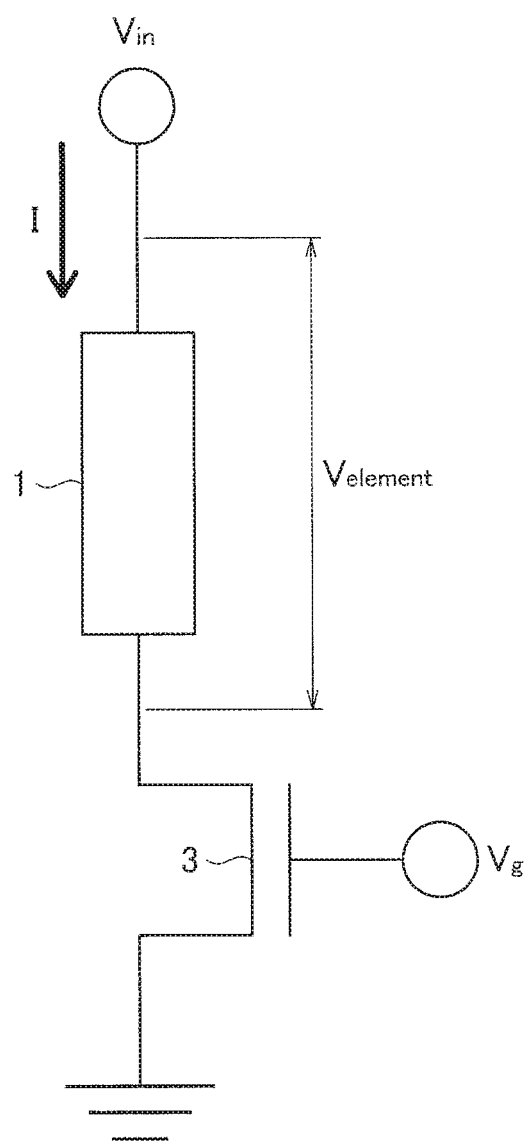
FIG. 3 is a circuit diagram of an evaluation circuit for measuring current-voltage characteristics of a circuit element in a first operation method.

First, current-voltage characteristics of the circuit element 1 in the case of performing control over the "off-state" of the switch layer 10 in accordance with a peak current value will be described. Thus, the circuit element 1 described above is incorporated into an evaluation circuit shown in FIG. 3, and current-voltage characteristics are measured. FIG. 3 is a circuit diagram of the evaluation circuit for measuring current-voltage characteristics of the circuit element 1 that performs control over the "off-state" according to a peak current value.

In the evaluation circuit shown in FIG. 3, the circuit element 1 according to the present embodiment and the drain of a field-effect transistor 3 (n-type) are connected, and the source of the field-effect transistor 3 is connected to the ground. In the circuit element 1, by connecting the field-effect transistor 3 in series and restricting a current flowing into the circuit element 1, an overcurrent is prevented from flowing into the circuit element 1 having a differential negative resistance region in current-voltage characteristics when in the "on-state". Note that the field-effect transistor 3 restricts the upper limit of the current value flowing into the circuit element 1 to $I_{comp}$, for example, by adjusting a gate voltage $V_g$.

Figure 4:
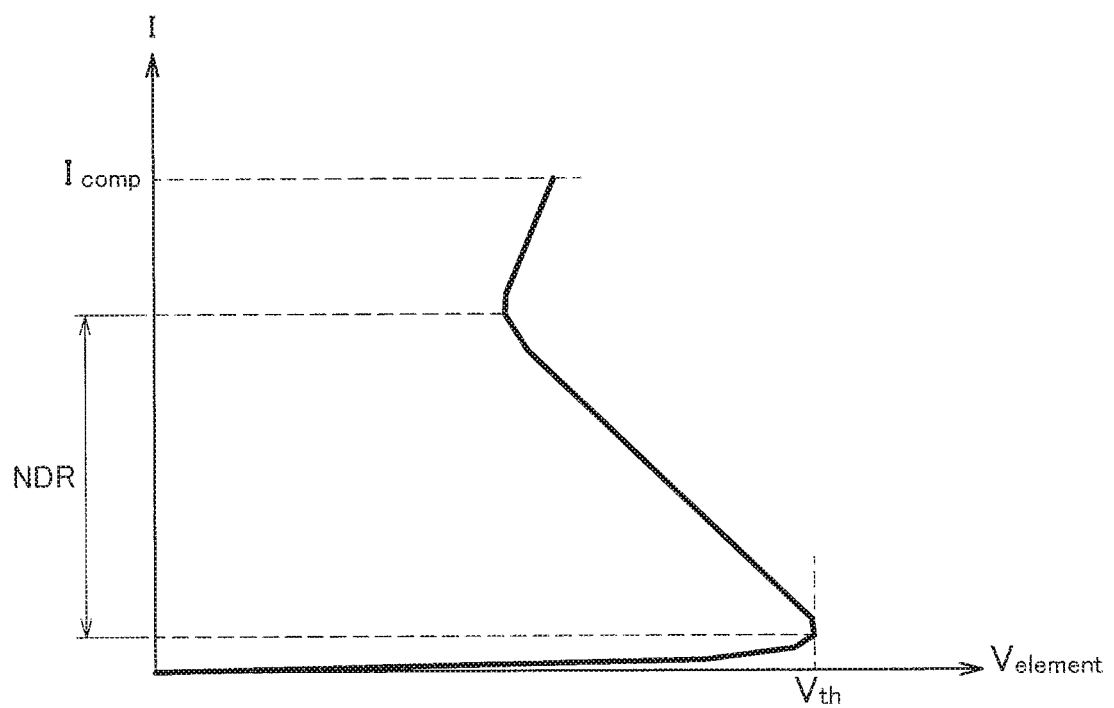
FIG. 4 is a graphic diagram showing schematic current-voltage characteristics of the circuit element in the first operation method.

Here, by applying a voltage $V_{in}$ from one of the electrodes of the circuit element 1 in the evaluation circuit shown in FIG. 3, the "on-state" and the "off-state" of the circuit element 1 are changed, and current-voltage characteristics of the circuit element 1 are measured. The schematic result is shown in FIG. 4. FIG. 4 is a graphic diagram showing schematic current-voltage characteristics of the circuit element 1.

As shown in FIG. 4, in the case where a voltage $V_{element}$ applied to the both ends of the circuit element 1 becomes more than or equal to a switching voltage $V_{th}$ of the circuit element 1, the circuit element 1 changes from the "off-state" to the "on-state", and the current I starts flowing abruptly. At this time, in the circuit element 1, current-voltage characteristics in which the applied voltage $V_{element}$ decreases while the flowing current I increases are shown. This is considered because, in the circuit element 1, current concentration occurs in a narrow region of the switch layer 10 sandwiched between the inert electrodes 21 and 22, and the degree of current concentration further increases along with an increase in voltage. Such an electric property in which the voltage decreases along with an increase in current will be referred to as a differential negative resistance. For example, in FIG. 4, a region indicated as "NDR" is equivalent to a region showing the differential negative resistance.

Note that, since the upper limit value of the current flowing into the circuit element 1 is restricted to $I_{comp}$ in accordance with the gate voltage $V_g$ applied to the field-effect transistor 3, current values more than or equal to $I_{comp}$ are not shown in FIG. 4.

Here, in the circuit element 1, the electric property in the "off-state" is controlled in accordance with the peak current value of the current flowing in the "on-state". That is, the electric property of the circuit element 1 in the "off-state" is controlled in accordance with the restriction value $I_{comp}$ for the current flowing into the circuit element 1. For example, in the case of controlling the electric property of the circuit element 1 in the "off-state" to each of a "first off-state" or a "second off-state", the restriction value for the current flowing into the circuit element 1 should only be controlled to be a value corresponding to each "off-state".

Figure 5:
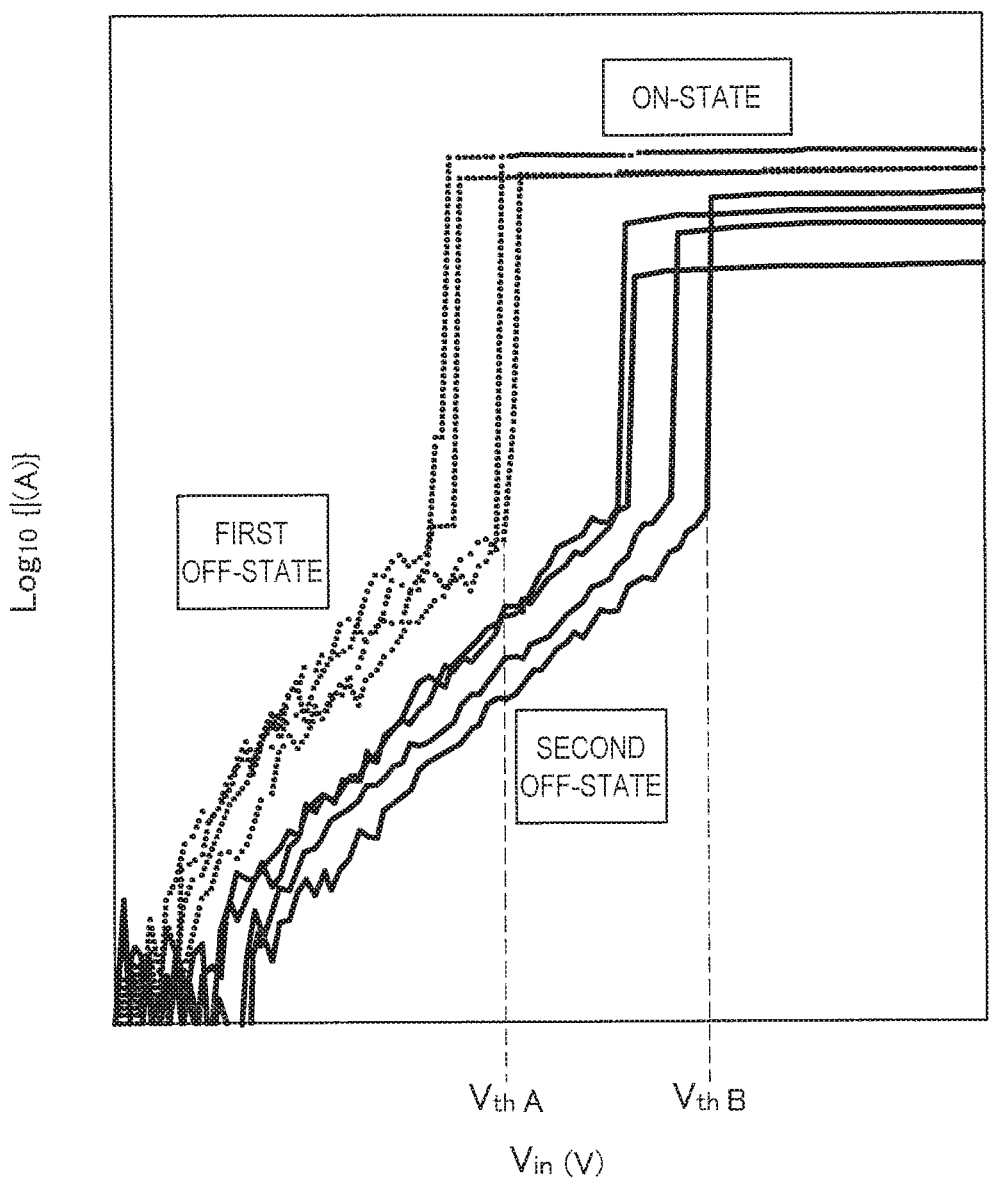
FIG. 5 is a graphic diagram showing the relation of a current I flowing into the circuit element to a voltage $V_{in}$ applied to the evaluation circuit of FIG. 3.
Figure 6:
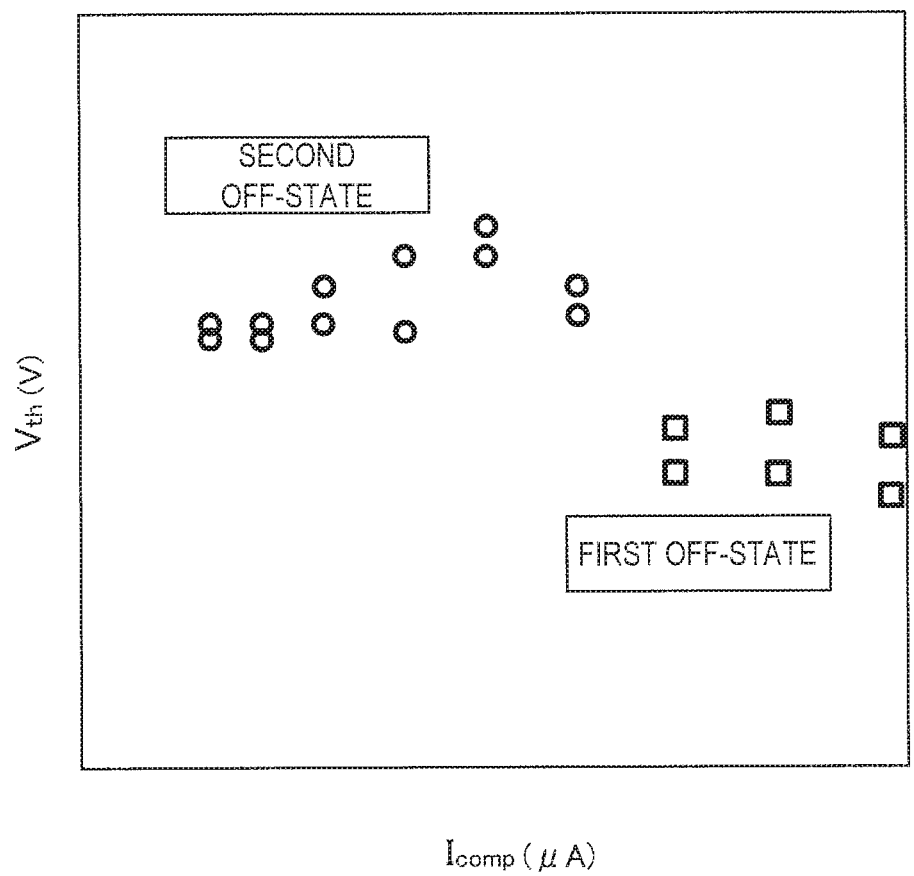
FIG. 6 is a graphic diagram showing changes in a switching voltage $V_{th}$ after flowing a current having a restriction value $I_{comp}$.

Specifically, as shown in FIG. 5 and FIG. 6, the "off-state" of the circuit element 1 is split into two values of the "first off-state" or the "second off-state" in accordance with the restriction value for the current flowing into the circuit element 1. Note that FIG. 5 is a graphic diagram showing the relation of the current I flowing into the circuit element 1 to the voltage $V_{in}$ applied to the evaluation circuit. In addition, FIG. 6 is a graphic diagram showing changes in the switching voltage $V_{th}$ after flowing a current having the restriction value $I_{comp}$.

As shown in FIG. 5, in the case of controlling the circuit element 1 to the "first off-state", for example, a restriction value $I_{comp}A$ for a current flowing in the "on-state" is controlled to be a predetermined value larger than $I_{comp}B$ which will be described later. Thereafter, when lowering the voltage $V_{in}$, the circuit element 1 transitions to the "first off-state" in which the leak current is more and the resistance value is smaller than in the "second off-state". Note that, in the "first off-state", a switching voltage $V_{th}A$ for causing a transition to the "on-state" is lower than a switching voltage $V_{th}B$ in the "second off-state".

On the other hand, in the case of controlling the circuit element 1 to the "second off-state", for example, a restriction value $I_{comp}B$ for a current flowing in the "on-state" is controlled to be a predetermined value smaller than $I_{comp}A$ described earlier. Thereafter, when lowering the voltage $V_{in}$, the circuit element 1 transitions to the "second off-state" in which the leak current is less and the resistance value is larger than in the "first off-state". Note that it is understood that, in the "second off-state", the switching voltage $V_{th}B$ for causing a transition to the "on-state" is higher than the switching voltage $V_{th}A$ in the "first off-state".

In addition, as shown in FIG. 6, it is understood that the switching voltage $V_{th}$ for causing a transition to the "on-state" is significantly different between the "first off-state" and the "second off-state" in the circuit element 1. Specifically, the switching voltage $V_{th}B$ in the "second off-state" shows a tendency to be higher than the switching voltage $V_{th}A$ in the "first off-state". In addition, in each of the "first off-state" or the "second off-state", it is understood that the switching voltage $V_{th}$ is almost constant even if the current restriction value $I_{comp}$ is varied.

Here, the circuit element 1 according to the present embodiment and a phase change memory will be compared.

A phase change memory is a storage element brought into a low resistance state (a so-called set state) when the crystalline state of a storage layer that stores information becomes a crystalline phase close to an alloy, and brought into a high resistance state (a so-called reset state) when the crystalline state of the storage layer becomes an amorphous phase. The phase change memory stores information according to the low resistance state (set state) and the high resistance state (reset state) of the storage layer.

Here, comparing a "set current" that changes the storage layer of the phase change memory into the set state and a "reset current" that changes the storage layer into the reset state, the "reset current" tends to be larger than the "set current". This is because, in order to cause a phase change from the crystalline phase to the amorphous phase, it is necessary to once return the storage layer to a molten state, and it is therefor necessary to flow a reset current larger than a set current into the storage layer. That is, in the phase change memory, the "set current" corresponds to a crystallization temperature of the storage layer, and the "reset current" corresponds to the melting point of the storage layer.

On the other hand, in the circuit element 1 according to the present embodiment, the "first off-state" in which the resistance value is lower is equivalent to the "set state", and the "second off-state" in which the resistance value is higher is equivalent to the "reset state". In the circuit element 1, however, the current value $I_{comp}A$ for causing a transition to the "first off-state" (set state) in which the resistance value is lower is larger than the current value $I_{comp}B$ for causing a transition to the "second off-state" (reset state) in which the resistance value is higher, unlike the phase change memory.

It is considered that this indicates that, in the circuit element 1 according to the present embodiment, a transition between the "first off-state" and the "second off-state" is controlled in a mechanism different from the phase change memory. Specifically, it is considered that it is indicated that, in the circuit element 1 according to the present embodiment, a phase change in the crystalline state of the switch layer 10 does not accompany a transition between the "first off-state" and the "on-state" and a transition between the "second off-state" and the "on-state".

With reference to the above results of FIG. 4 to FIG. 6, it is understood that the circuit element 1 according to the present embodiment has at least two or more "off-states" having different electric properties, and each "off-state" can be controlled in accordance with the current value flowing in the "on-state". Consequently, the circuit element 1 can function as a storage element that stores information by setting the logical value "1" for the "first off-state" and setting the logical value "0" for the "second off-state", for example.

In addition, since the circuit element 1 according to the present embodiment also functions as a selection element that can make a change between the "on-state" and the "off-state" by applying a voltage higher than or equal to a threshold value, it is possible to suppress occurrence of a sneak current when writing and reading information into/from the storage element.

Note that the circuit element 1 with which the results shown in FIG. 4 to FIG. 6 have been measured is merely an example of the circuit element 1 according to the present embodiment, and the circuit element 1 according to the present embodiment is not limited to the foregoing. For example, the circuit element 1 according to the present embodiment may have an "off-state" split into further multiple values of three or more.

2.2. Control Over Off-State in Accordance with Polarity of Applied Voltage

Figure 7:
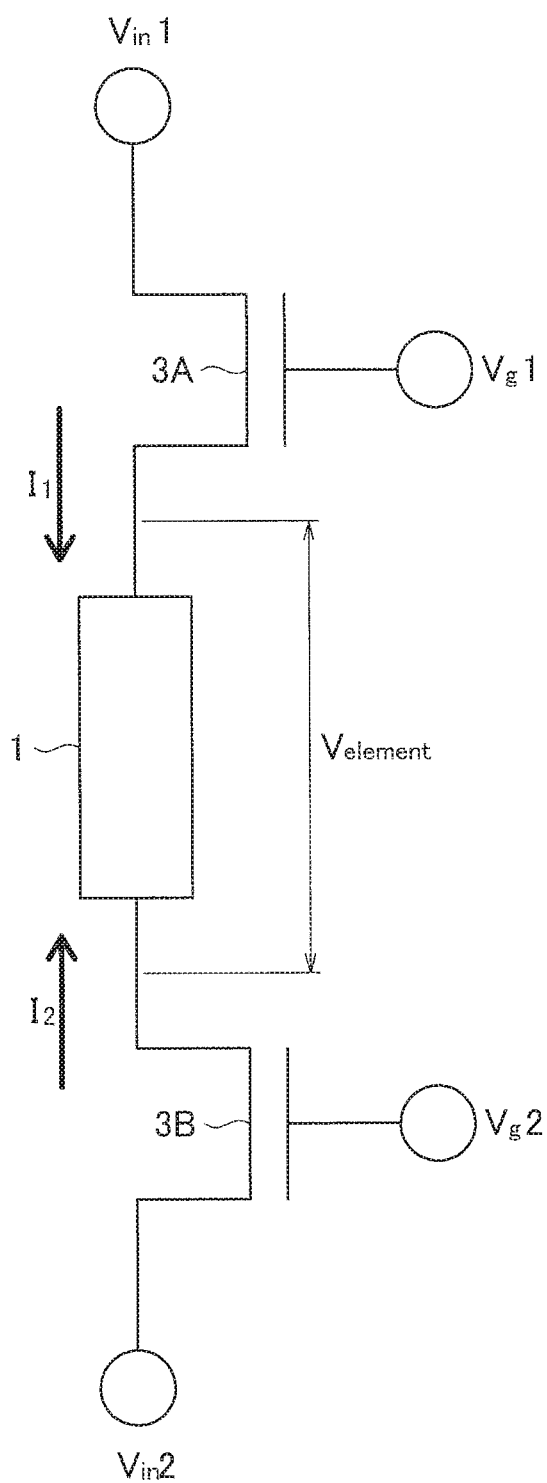
FIG. 7 is a circuit diagram of an evaluation circuit for measuring current-voltage characteristics of a circuit element in a second operation method.

Next, current-voltage characteristics of the circuit element 1 in the case of performing control over the "off-state" of the switch layer 10 in accordance with the polarity of an applied voltage will be described. The circuit element 1 described above is incorporated into an evaluation circuit shown in FIG. 7, and current-voltage characteristics are measured. FIG. 7 is a circuit diagram of the evaluation circuit for measuring current-voltage characteristics of the circuit element 1 that performs control over the "off-state" in accordance with the polarity of an applied voltage.

In the evaluation circuit shown in FIG. 7, the circuit element 1 according to the present embodiment and field-effect transistors 3A, 3B are connected in series. Specifically, the field-effect transistor 3A is connected to one (for the sake of convenience, also referred to as the inert electrode 21) of the inert electrodes of the circuit element 1, and the field-effect transistor 3B is connected to the other (for the sake of convenience, also referred to as the inert electrode 22) of the inert electrodes of the circuit element 1.

Since a current flows from each side of the inert electrodes 21 and 22 of the circuit element 1 in the circuit element 1 shown in FIG. 7, a current value flowing into the circuit element 1 when in the "on-state" is controlled by connecting the field-effect transistors 3A, 3B in series to the respective sides of the inert electrodes 21 and 22. For example, when flowing a current from the inert electrode 21 side to the inert electrode 22 side, $V_{in}1$ is connected to a power supply, and the field-effect transistor 3A exerts the function of applying a voltage to the inert electrode 21 by operating in a saturation region and controlling a gate voltage $V_g1$ set at a sufficiently high voltage. In addition, $V_{in}2$ is connected to the ground, and the field-effect transistor 3B exerts the function of controlling a current value $I_1$ flowing into the circuit element 1 by adjusting a gate voltage $V_g2$. On the other hand, when flowing a current from the inert electrode 22 side to the inert electrode 21 side, the function of $V_{in}1$ and the field-effect transistor 3A and the function of $V_{in}2$ and the field-effect transistor 3B described above are reversed to control a current value $I_2$ flowing into the circuit element 1.

Therefore, in the case where a voltage $V_{element}$ applied to the both ends of the circuit element 1 becomes more than or equal to a switching voltage $V_{th}$ of the circuit element 1, the circuit element 1 changes from the "off-state" to the "on-state", and the current I1 or the current I2 starts flowing abruptly. At this time, in the circuit element 1, current-voltage characteristics in which the applied voltage $V_{element}$ decreases while the flowing current I1 or the flowing current I2 increases are shown. This is considered because, in the circuit element 1, current concentration occurs in a narrow region of the switch layer 10 sandwiched between the inert electrodes 21 and 22, and the degree of current concentration further increases along with an increase in voltage.

Here, the electric property of the circuit element 1 in the "off-state" is controlled in accordance with the polarity of a current flowing in the "on-state". For example, in the case of controlling the electric property of the circuit element 1 in the "off-state" to the "first off-state", the current $I_1$ may be flown from the inert electrode 21 side to the inert electrode 22 side. In addition, in the case of controlling the electric property of the circuit element 1 in the "off-state" to the "second off-state", the current $I_2$ may be flown from the inert electrode 22 side to the inert electrode 21 side.

In addition, in the evaluation circuit shown in FIG. 7, after flowing the current $I_1$ and $I_2$ from each side of the inert electrodes 21 and 22 of the circuit element 1 to bring the circuit element 1 into the "on-state", the current $I_1$ is flown into the circuit element 1 from the inert electrode 21 side toward the inert electrode 22 side, and current-voltage characteristics of the circuit element 1 are measured. The measurement results are shown in FIG. 8.

Figure 8:
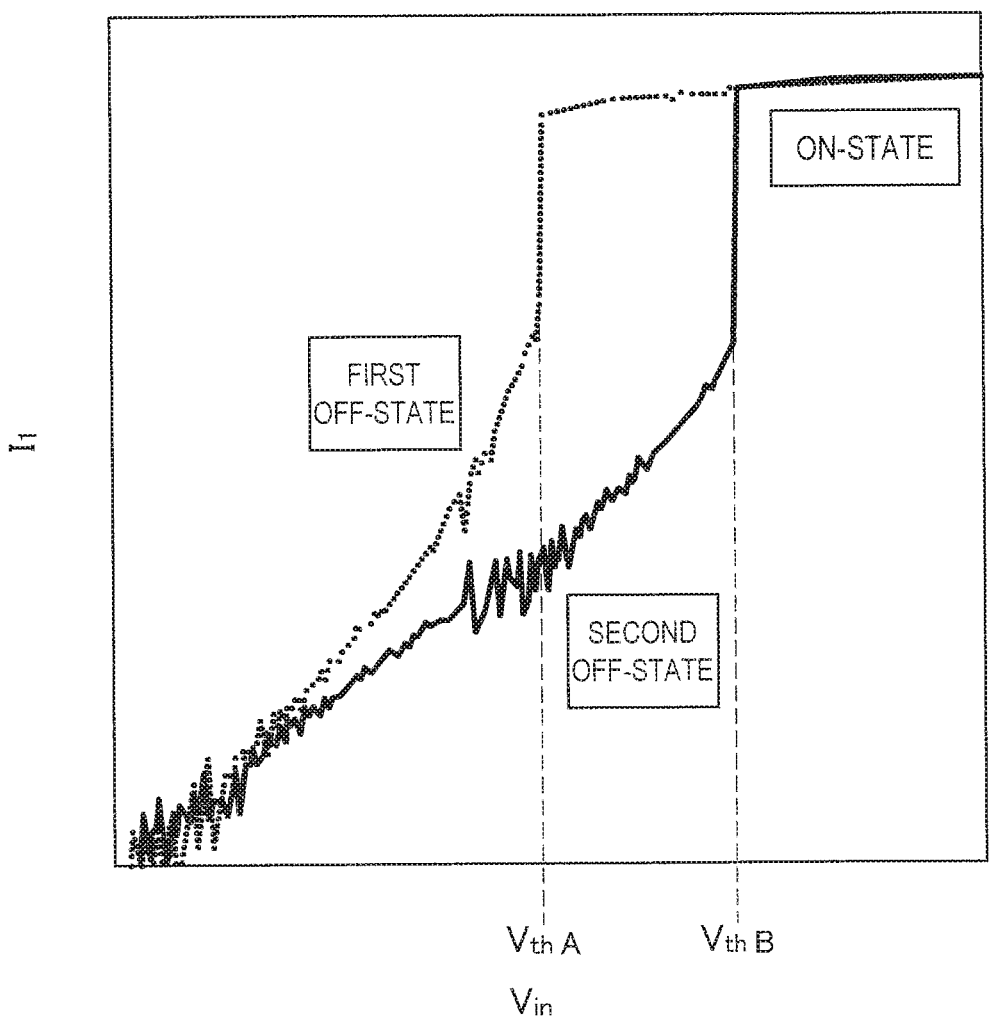
FIG. 8 is a graphic diagram showing the relation of the current I flowing into the circuit element to the voltage $V_{in}$ applied to the evaluation circuit of FIG. 7.

As shown in FIG. 8, it is understood that, in the circuit element 1, the "off-state" of the circuit element 1 is split into two values of the "first off-state" or the "second off-state" in accordance with the direction of the current flowing into the circuit element 1 in the "on-state" (that is, the polarity of a voltage applied to the circuit element 1 in the "on-state").

For example, in the case of flowing a current from the inert electrode 21 side to the inert electrode 22 side to bring the circuit element 1 into the "on-state", the "off-state" of the circuit element 1 becomes the "first off-state" in which the leak current is more and the resistance value is smaller than in the "second off-state". In addition, in the case of flowing a current from the inert electrode 22 side to the inert electrode 21 side to bring the circuit element 1 into the "on-state", the "off-state" of the circuit element 1 becomes the "second off-state" in which the leak current is less and the resistance value is larger than in the "first off-state". Note that, in the "first off-state", the switching voltage $V_{th}A$ for causing a transition to the "on-state" becomes lower than the switching voltage $V_{th}B$ for causing a transition to the "on-state" in the "second off-state".

However, depending on the configuration (for example, material, shape, or interface state with the switch layer 10) of the inert electrodes 21 and 22, the relation between the polarity of a voltage (that is, the direction of a current) and the "first off-state" and the "second off-state" may be reversed without agreeing with the foregoing.

Here, it is possible to control the difference in electric property (specifically, the difference in leak current and switching voltage) between the "first off-state" and the "second off-state" specifically in accordance with the material, shape, interface state with the switch layer 10, and the like of the inert electrodes 21 and 22. For example, as the difference between the above-described respective configurations of the inert electrodes 21 and 22 increases to make the electric properties of the inert electrodes 21 and 22 more asymmetrical, the difference in leak current and switching voltage between the "first off-state" and the "second off-state" can be increased. This is considered because the asymmetry between the electric properties of the inert electrodes 21 and 22 causes the amount of thermal energy produced by a current flowing into the switch layer 10 and the propagation path to change in accordance with the direction of the current to change the state of the switch layer 10 in the "off-state".

3. First Operation Method for Circuit Element

3.1. Writing Method in First Operation Method

With reference to FIG. 7 to FIG. 10, a first operation method for the circuit element 1 according to the present embodiment will be described. First, with reference to FIG. 7 and FIG. 8, a method of writing information into the circuit element 1 in the first operation method will be described. FIG. 7 is a schematic diagram describing a circuit for writing into the circuit element 1 in the first operation method. In addition, FIG. 8 is a graphic diagram showing current-voltage characteristics of the circuit element 1 in the present writing method.

As shown in FIG. 7, in the storage device 2, the circuit elements 1, each of which functions as a storage element and a selection element, are provided at the intersection points of bit lines (BL1, BL2, BL3, BL4) and word lines (WL1, WL2, WL3, WL4). In addition, the power supplies 5 provided on the outer edge of the memory cell array are connected to the bit lines and word lines.

Here, when the switching voltage $V_{th}$ for changing the switch layer 10 of the circuit element 1 to the "on-state" is applied between a specific bit line and a specific word line in accordance with supply of electric power from the power supply 5, one of the circuit elements 1 is uniquely selected from the memory cell array of the storage device 2.

Next, when a restriction current of $I_{comp}A$ or $I_{comp}B$ shown in FIG. 8 flows in the circuit element 1 selected by applying the switching voltage $V_{th}$, the "off-state" of the circuit element 1 is controlled to be either the "first off-state" or the "second off-state". The restriction currents $I_{comp}A$ and $I_{comp}B$ are values of restriction currents corresponding to the "first off-state" and the "second off-state", respectively. Accordingly, in the storage device 2, writing of information into the circuit element 1 is performed. On the other hand, since an unselected circuit element 1 to which the switching voltage $V_{th}$ is not applied is in the "off-state", and has a high resistance value, a sneak current that bypasses the selected circuit element 1 in the "on-state" is hardly produced.

Note that control over the restriction current $I_{comp}A$ or $I_{comp}B$ can be performed by a current limiting circuit (not shown) provided on the outer edge of the memory cell array, for example. In addition, the current density required for controlling the "off-state" of the circuit element 1 at this time may be more than or equal to 10 kA/cm², for example.

3.3. Reading Method in First Operation Method

Figure 9:
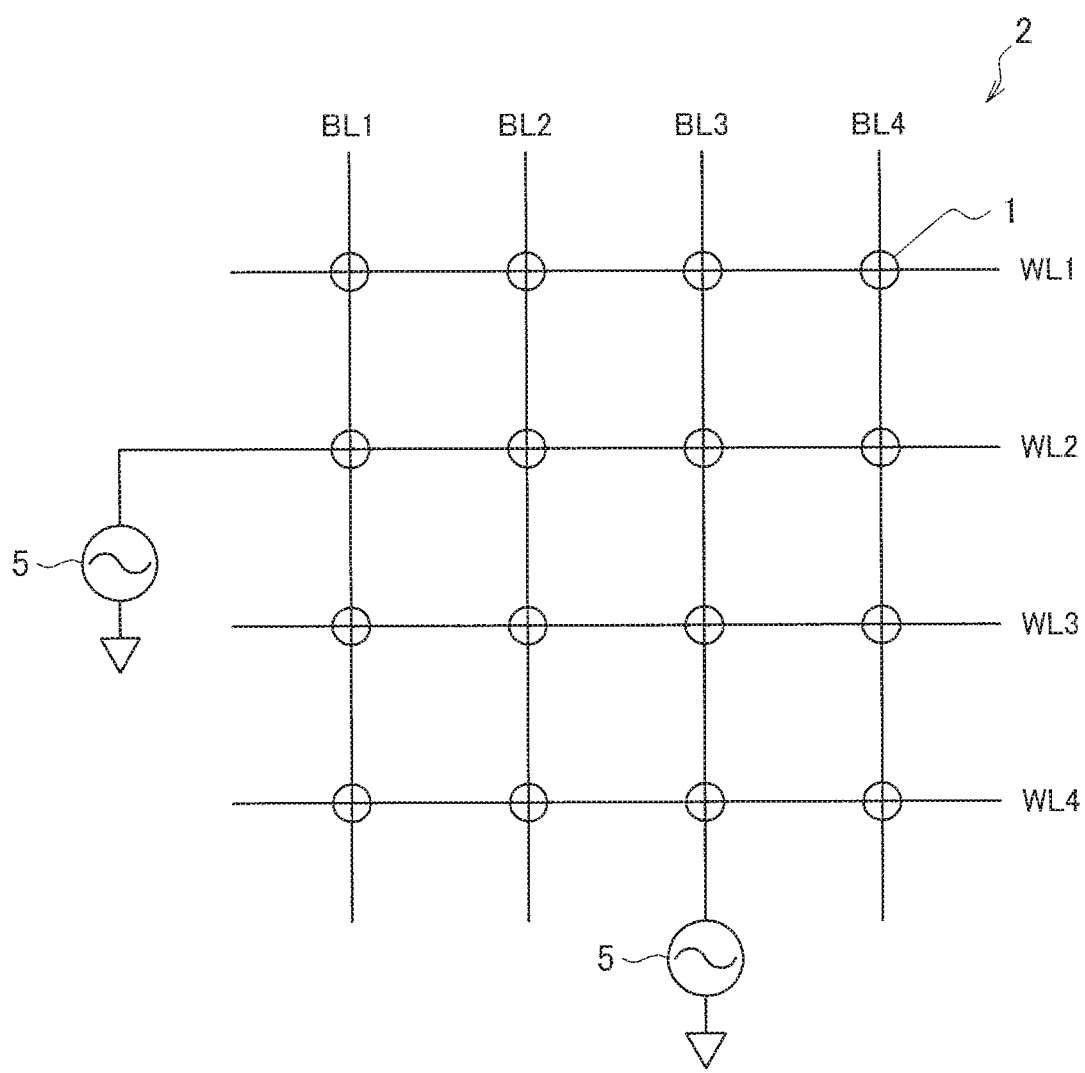
FIG. 9 is a schematic diagram describing a writing circuit of the storage device through use of circuit elements according to the present embodiment.
Figure 10:
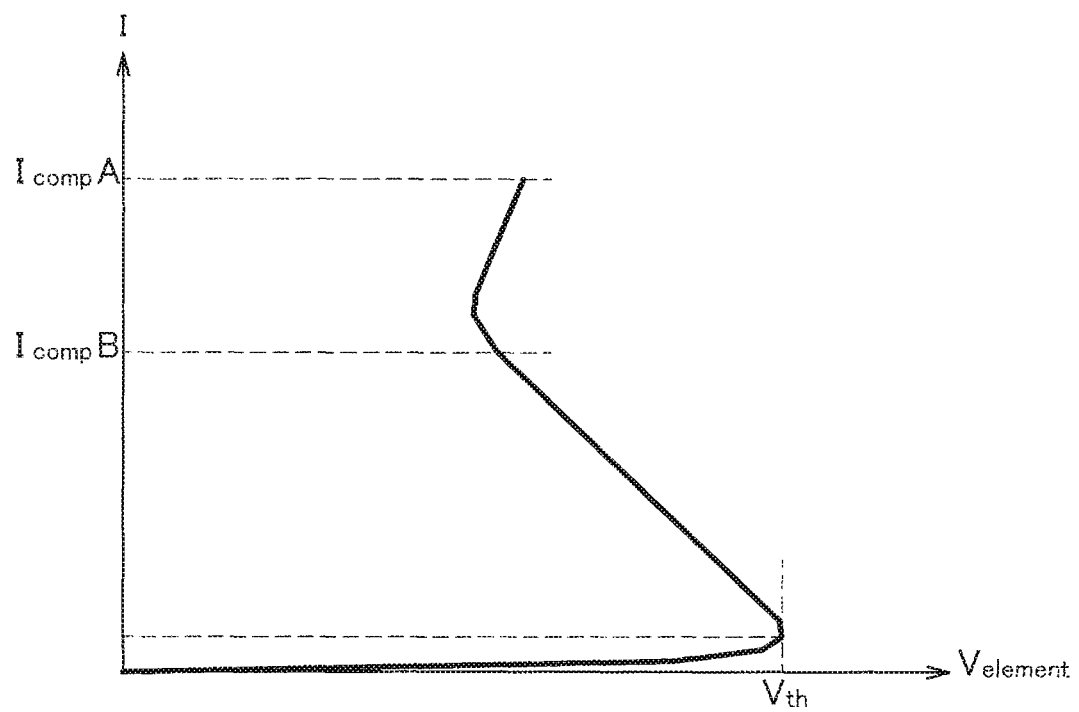
FIG. 10 is a graphic diagram showing current-voltage characteristics of a circuit element in the first operation method.
Figure 11:
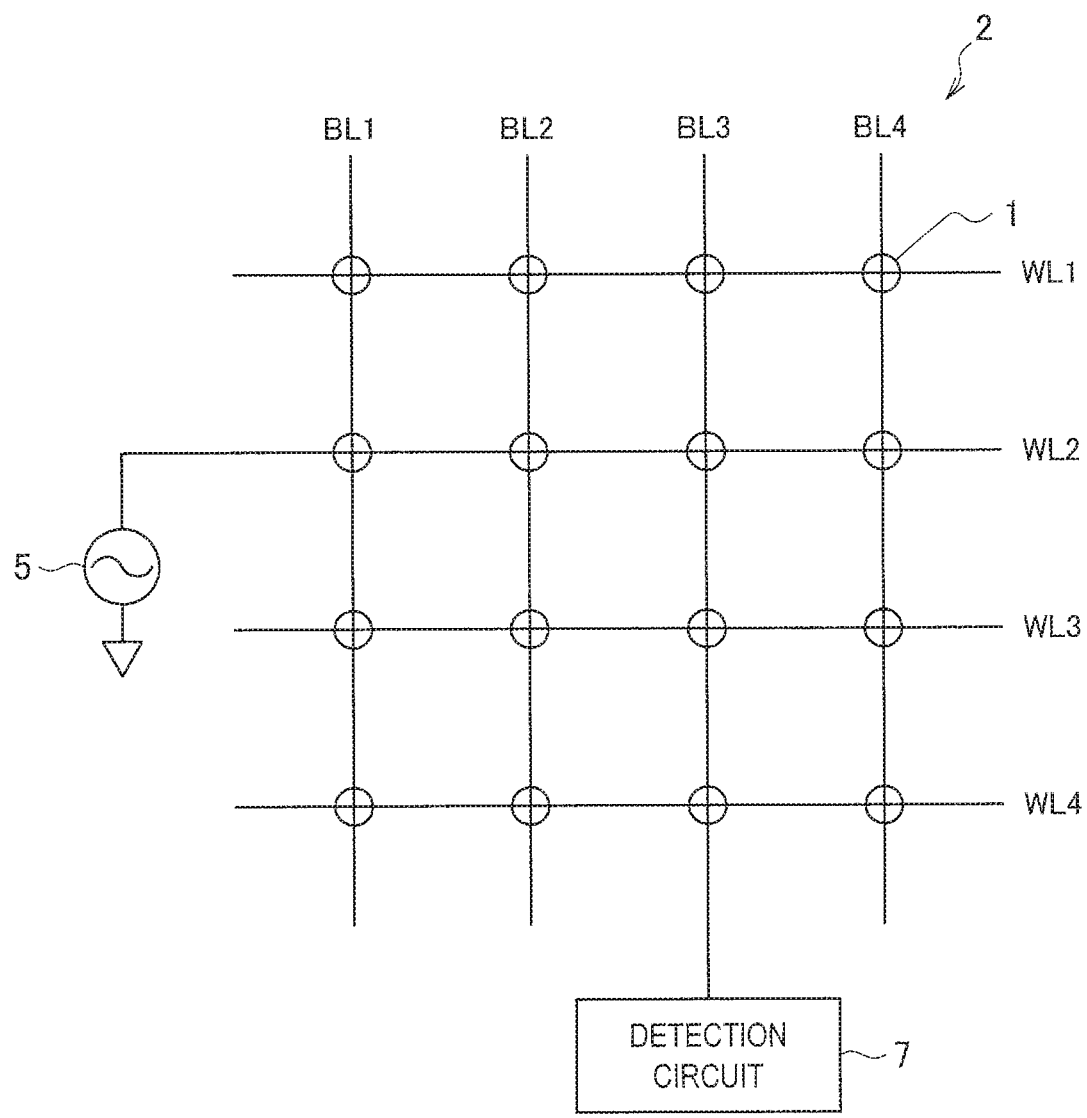
FIG. 11 is a schematic diagram describing a reading circuit of the storage device through use of the circuit elements according to the present embodiment.
Figure 12:
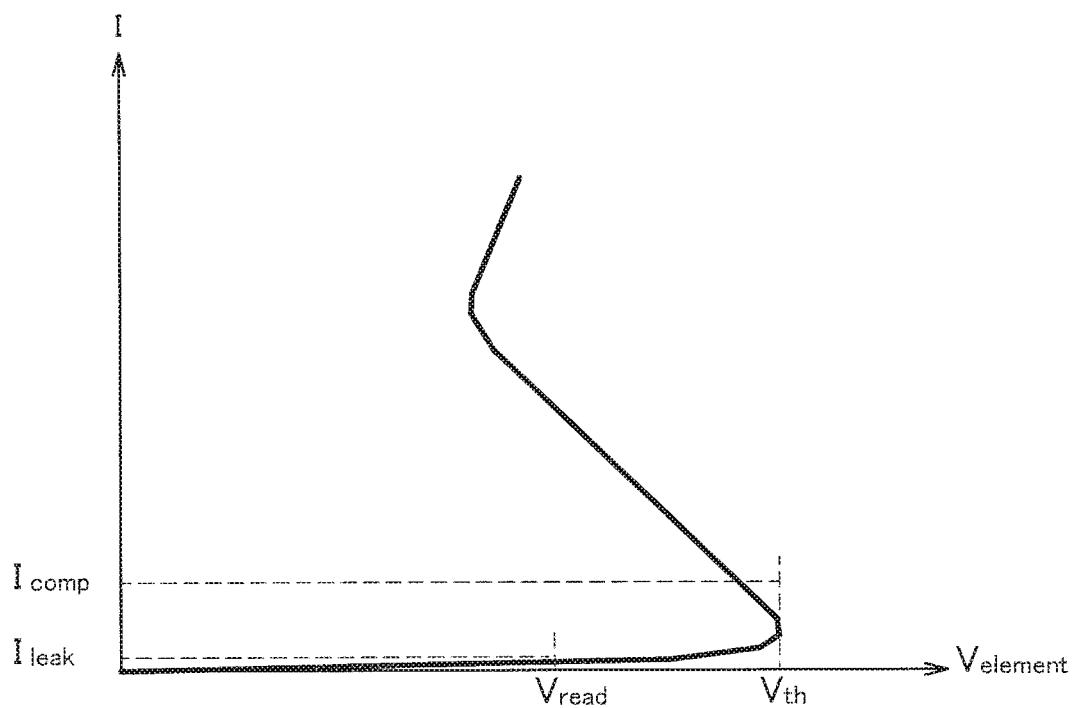
FIG. 12 is a graphic diagram showing current-voltage characteristics of a circuit element in the first operation method.

Next, with reference to FIG. 9 and FIG. 10, a method of reading information from the circuit element 1 in the first operation method will be described. FIG. 9 is a schematic diagram describing a circuit for reading from the circuit element 1 in the first operation method. In addition, FIG. 10 is a graphic diagram showing current-voltage characteristics of the circuit element 1 in the present reading method.

As shown in FIG. 9, in the storage device 2, the circuit elements 1, each of which functions as a storage element and a selection element, are provided at the intersection points of bit lines (BL1, BL2, BL3, BL4) and word lines (WL1, WL2, WL3, WL4). In addition, the power supplies 5 and a detection circuit 7 provided on the outer edge of the memory cell array are connected to the bit lines and word lines. Note that the circuit elements 1 are each controlled to be either the "first off-state" or the "second off-state" to store information.

Here, a reading voltage $V_{read}$ smaller than the switching voltage $V_{th}$ of the circuit element 1 is applied between a specific bit line and a specific word line in accordance with supply of electric power from the power supply 5, one of the circuit elements 1 is uniquely selected from the memory cell array of the storage device 2.

Next, when a leak current $I_{leak}$ of the circuit element 1 selected by the application of the reading voltage $V_{read}$ is detected by the detection circuit 7, it is determined in which of the "first off-state" or the "second off-state" the "off-state" the circuit element 1 remains. Since the "first off-state" and the "second off-state" are different in resistance value and magnitude of the leak current, the detection circuit 7 can determine in which the "off-state" of the circuit element 1 remains by detecting the leak current $I_{leak}$ in the selected circuit element 1. Accordingly, in the storage device 2, reading of information from the circuit element 1 is performed. On the other hand, since an unselected circuit element 1 to which the reading voltage $V_{read}$ is not applied is in the "off-state", and has a high resistance value, a sneak current that bypasses the selected circuit element 1 in the "on-state" is hardly produced.

In addition, the detection circuit 7 may determine whether the "off-state" of the circuit element 1 is either the "first off-state" or the "second off-state" by detecting the switching voltage $V_{th}$. Before the current flowing into the circuit element 1 reaches the differential negative resistance region, the "off-state" of the circuit element 1 does not change. Therefore, the storage device 2 sets the restriction current $I_{comp}$ such that a voltage applied to the circuit element 1 slightly exceeds the switching voltage $V_{th}$, and the detection circuit 7 may determine the "off-state" of the circuit element 1 by measuring the magnitude of the switching voltage $V_{th}$. In the case where the switching voltage $V_{th}$ is used for the determination about the "off-state" of the circuit element 1, the detection circuit 7 can determine the "off-state" of the circuit element 1 more easily since the switching voltage $V_{th}$ is larger than the leak current $I_{leak}$ in the absolute value of the detection value.

Note that control over the restriction current $I_{comp}A$ or $I_{comp}A$ can be performed by the current limiting circuit (not shown) provided on the outer edge of the memory cell array, for example.

4. Second Operation Method for Circuit Element

4.1. Writing Method in Second Operation Method

Next, with reference to FIG. 13 to FIG. 16, a second operation method for the circuit element 1 according to the present embodiment will be described. First, a method of writing information into the circuit element 1 in the second operation method will be described.

Since a circuit for writing into the circuit element 1 in the second operation method is substantially similar to the circuit for writing into the circuit element 1 in the first operation method, description will be provided with reference to FIG. 7.

Specifically, as shown in FIG. 7, in the storage device 2, the circuit elements 1, each of which functions as a storage element and a selection element, are provided at the intersection points of bit lines (BL1, BL2, BL3, BL4) and word lines (WL1, WL2, WL3, WL4). For example, a bit line may be connected to the inert electrode 21 provided below the circuit element 1, and a word line may be connected to the inert electrode 22 provided above the circuit element 1. In addition, outside the memory cell array provided with a plurality of circuit elements 1, a current limiting circuit that restricts a current flowing into the circuit elements 1 and the power supplies 5 that supply electric power to the circuit elements 1 are provided.

Here, when the switching voltage $V_{th}$ for changing the switch layer 10 of the circuit element 1 to the "on-state" is applied between a specific bit line and a specific word line, one of the circuit elements 1 is uniquely selected from the memory cell array of the storage device 2.

Here, in a circuit element 1 selected by applying the switching voltage $V_{th}$, the "off-state" of the circuit element 1 is controlled to be either the "first off-state" or the "second off-state" in accordance with the polarity of the applied switching voltage $V_{th}$. The polarity of the switching voltage $V_{th}$ can be controlled in accordance with which of a bit line or a word line a voltage is applied to, for example. For example, by applying the switching voltage $V_{th}$ (for example, 4V or the like) to a bit line BL3 and grounding a word line WL2, it is possible to flow a current into a circuit element 1 present at the intersection point of the bit line BL3 and the word line WL2. Accordingly, the circuit element 1 into which a current has been flown is brought into the "on-state", and when the "off-state" of the circuit element 1 is controlled to be either the "first off-state" or the "second off-state", information is stored in the circuit element 1.

At this time, since the unselected circuit elements 1 to which the switching voltage $V_{th}$ is not applied are in the "off-state" and have a high resistance value, a sneak current that bypasses the selected circuit element 1 in the "on-state" is hardly produced. In addition, it is also possible to apply a voltage smaller than the switching voltage $V_{th}$ (for example, approximately 2 V), for example, to unselected bit lines BL1, BL2, and BL4 and unselected word lines WL1, WL3, and WL4 such that the unselected circuit elements 1 are not brought into the "on-state".

Note that, since the "first off-state" and the "second off-state" of the circuit element 1 are controlled in accordance with the polarity of a voltage applied to the circuit element 1 in the second operation method, a current limiting circuit that restricts a current flowing into the circuit element 1 may not be provided. In addition, the restriction value for a current flowing into the circuit element 1 may be changed between the case of controlling the circuit element 1 to be the "first off-state" and the case of controlling the circuit element 1 to the "second off-state". Further, it is possible that the restriction value for a current flowing into the circuit element 1 is not provided in either of the case of controlling the circuit element 1 to the "first off-state" and the case of controlling the circuit element 1 to the "second off-state".

4.2. Reading Method in Second Operation Method

Next, with reference to FIGS. 13 to 15, a method of reading information from the circuit element 1 in the second operation method will be described.

Since a circuit for reading from the circuit element 1 in the second operation method is substantially similar to the circuit for reading from the circuit element 1 in the second operation method, description will be provided with reference to FIG. 9.

Specifically, as shown in FIG. 9, in the storage device 2, the circuit elements 1, each of which functions as a storage element and a selection element, are provided at the intersection points of bit lines (BL1, BL2, BL3, BL4) and word lines (WL1, WL2, WL3, WL4). In addition, outside the memory cell array provided with a plurality of circuit elements 1, the power supplies 5 that supply electric power to the circuit elements 1 and the detection circuit 7 that detects current-voltage characteristics of the circuit elements 1 are provided. Note that the circuit elements 1 are each controlled to be either the "first off-state" or the "second off-state" to store information.

Here, a reading voltage $V_{read}$ smaller than the switching voltage $V_{th}$ of the circuit element 1 is applied between a specific bit line and a specific word line, one of the circuit elements 1 is uniquely selected from the memory cell array of the storage device 2.

Next, when a leak current $I_{leak}$ of the circuit element 1 selected by the application of the reading voltage $V_{read}$ is detected by the detection circuit 7, it is determined in which of the "first off-state" or the "second off-state" the circuit element 1 remains. For example, since the "first off-state" and the "second off-state" are different in resistance value and magnitude of the leak current, the detection circuit 7 can determine in which the "off-state" of the circuit element 1 remains by detecting the leak current $I_{leak}$ in the selected circuit element 1. Accordingly, in the storage device 2, reading of information from the circuit element 1 is performed. On the other hand, since an unselected circuit element 1 to which the reading voltage $V_{read}$ is not applied is in the "off-state", and has a high resistance value, a sneak current that bypasses the selected circuit element 1 in the "on-state" is hardly produced.

Here, with reference to FIG. 13 to FIG. 15, the magnitude and polarity of the voltage $V_{read}$ used when reading information from the circuit element 1 will be described. FIG. 13 to FIG. 15 are schematic diagrams describing an example of voltage pulses applied to the circuit element 1 in the second operation method.

Figure 13:
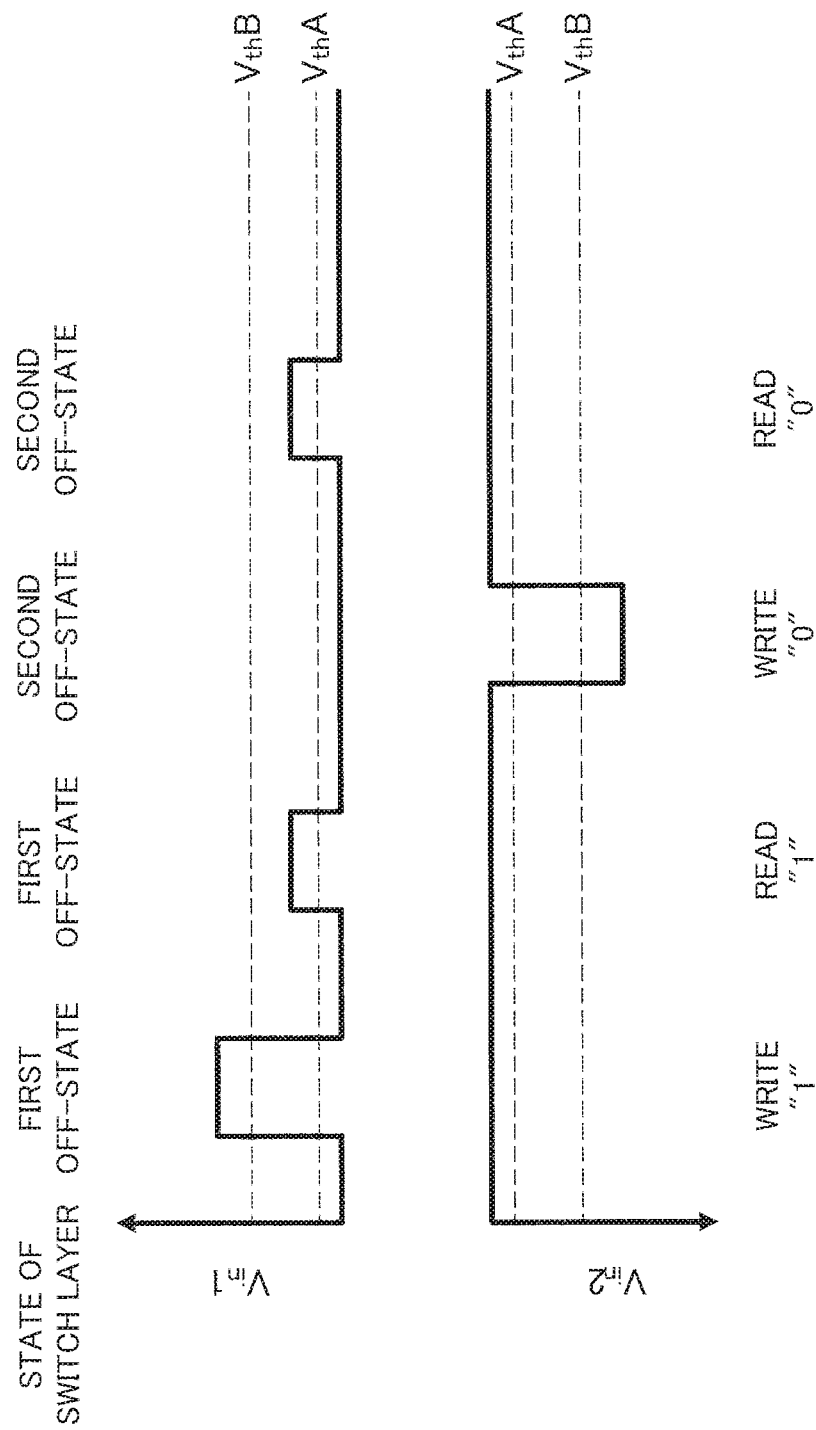
FIG. 13 is a schematic diagram describing an example of a voltage pulse applied to a circuit element 1 in the second operation method.

As shown in FIG. 13, the polarity of the voltage $V_{read}$ applied to $V_{in}1$ when reading information (READ "1" or READ "2") may be the same as the polarity at which the circuit element 1 is controlled to be the first off-state (for example, the first off-state in the current-voltage characteristics shown in FIG. 8) in which the switching voltage is $V_{th}A$ lower than $V_{th}B$. In addition, at this time, the magnitude of the reading voltage $V_{read}$ may be a magnitude between the switching voltage $V_{th}A$ in the "first off-state" and the switching voltage $V_{th}B$ in the "second off-state". With this configuration, the reading voltage $V_{read}$ can be made higher in order to improve the information reading accuracy, while preventing information stored in the circuit element 1 from being changed.

In FIG. 13, since the reading voltage $V_{read}$ is higher than the switching voltage $V_{th}A$ in the "first off-state" in the case where the circuit element 1 is in the "first off-state" (WRITE "1"), the circuit element 1 is brought into the "on-state" by the reading voltage $V_{read}$ when reading information (READ "1"). However, since the polarity of the reading voltage $V_{read}$ is the same as the polarity at which the "off-state" of the circuit element 1 is controlled to be the "first off-state", information stored in the circuit element 1 is held even in the case where information reading is performed.

On the other hand, since the reading voltage $V_{read}$ is lower than the switching voltage $V_{th}B$ in the "second off-state" in the case where the circuit element 1 is in the "second off-state" (WRITE "0"), the circuit element 1 is not brought into the "on-state" by the reading voltage $V_{read}$ when reading information (READ "0"). Consequently, information stored in the circuit element 1 is held even in the case where information reading is performed.

In addition, it can also be considered in a similar manner in the case where the electric property of the circuit element 1 is reversed. That is, the circuit element 1 may have an electric property in which, in the case of flowing a current from the inert electrode 21 side to the inert electrode 22 side, the "first off-state" in which the leak current is less and the resistance value is larger than in the "second off-state" is brought about. At this time, it is assumed that, in the case of flowing a current from the inert electrode 22 side to the inert electrode 21 side, the circuit element 1 is brought into the "second off-state" in which the leak current is more and the resistance value is smaller than in the "first off-state".

Figure 14:
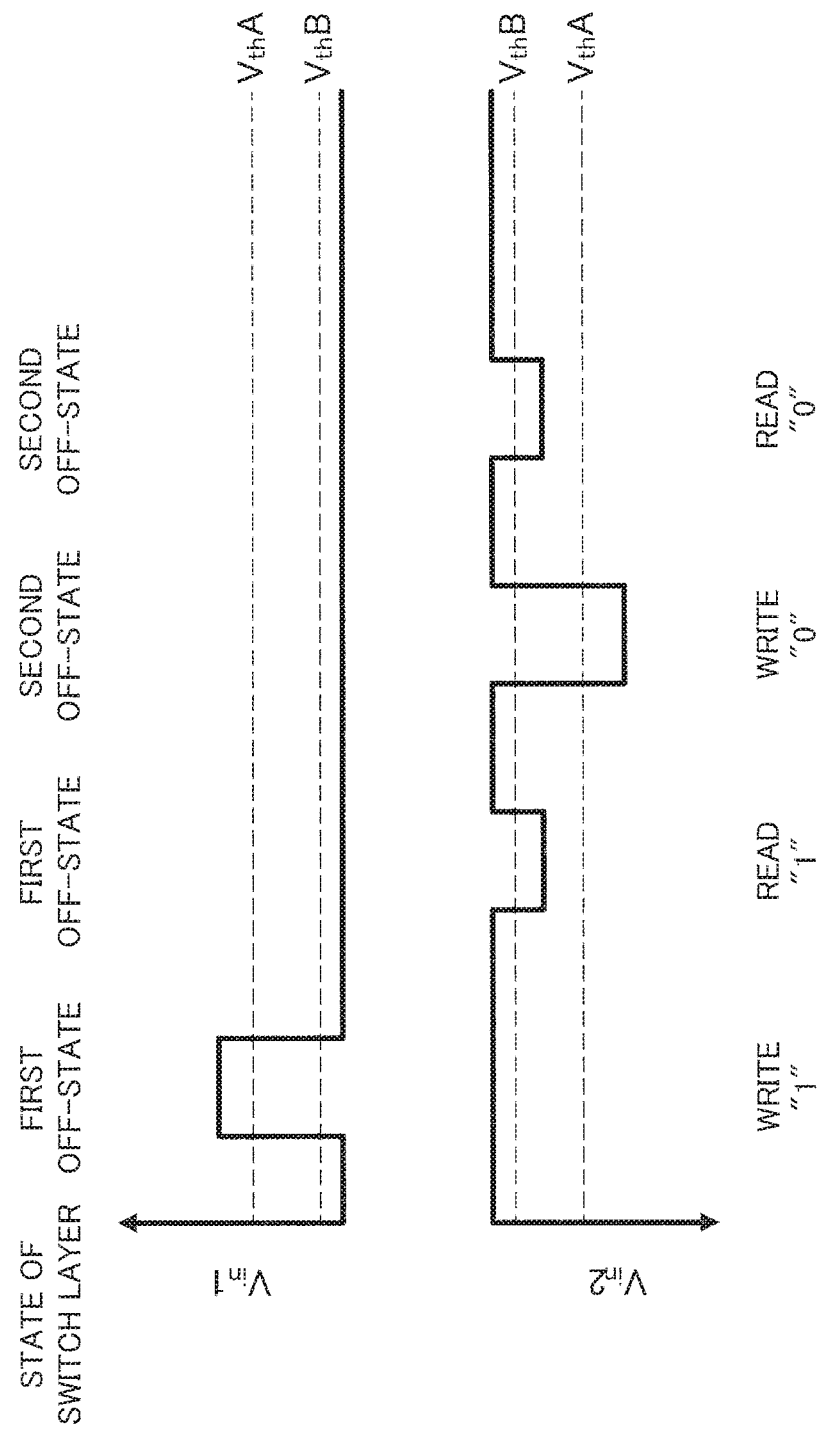
FIG. 14 is a schematic diagram describing another example of a voltage pulse applied to the circuit element 1 in the second operation method.

Even in such a case, as shown in FIG. 14, the polarity of the voltage $V_{read}$ applied to $V_{in}1$ when reading information (READ "1" or READ "2") may be the same as the polarity at which the circuit element 1 is controlled to be the second off-state (for example, the first off-state in the current-voltage characteristics shown in FIG. 8) in which the switching voltage is $V_{th}B$ lower than $V_{th}A$. In addition, at this time, the magnitude of the reading voltage $V_{read}$ may be a magnitude between the switching voltage $V_{th}B$ in the "second off-state" and the switching voltage $V_{th}A$ in the "first off-state".

In FIG. 14, since the reading voltage $V_{read}$ is lower than the switching voltage $V_{th}A$ in the "first off-state" in the case where the circuit element 1 is in the "first off-state" (WRITE "1"), the circuit element 1 is not brought into the "on-state" by the reading voltage $V_{read}$ when reading information (READ "0"). Consequently, information stored in the circuit element 1 is held even in the case where information reading is performed.

On the other hand, since the reading voltage $V_{read}$ is higher than the switching voltage $V_{th}B$ in the "second off-state" in the case where the circuit element 1 is in the "second off-state" (WRITE "0"), the circuit element 1 is brought into the "on-state" by the reading voltage $V_{read}$ when reading information (READ "1"). However, since the polarity of the reading voltage $V_{read}$ is the same as the polarity at which the "off-state" of the circuit element 1 is controlled to be the "second off-state", information stored in the circuit element 1 is held even in the case where information reading is performed.

Consequently, even in such a case, the reading voltage $V_{read}$ can be made higher in order to improve the information reading accuracy, while preventing information stored in the circuit element 1 from being changed.

Figure 15:
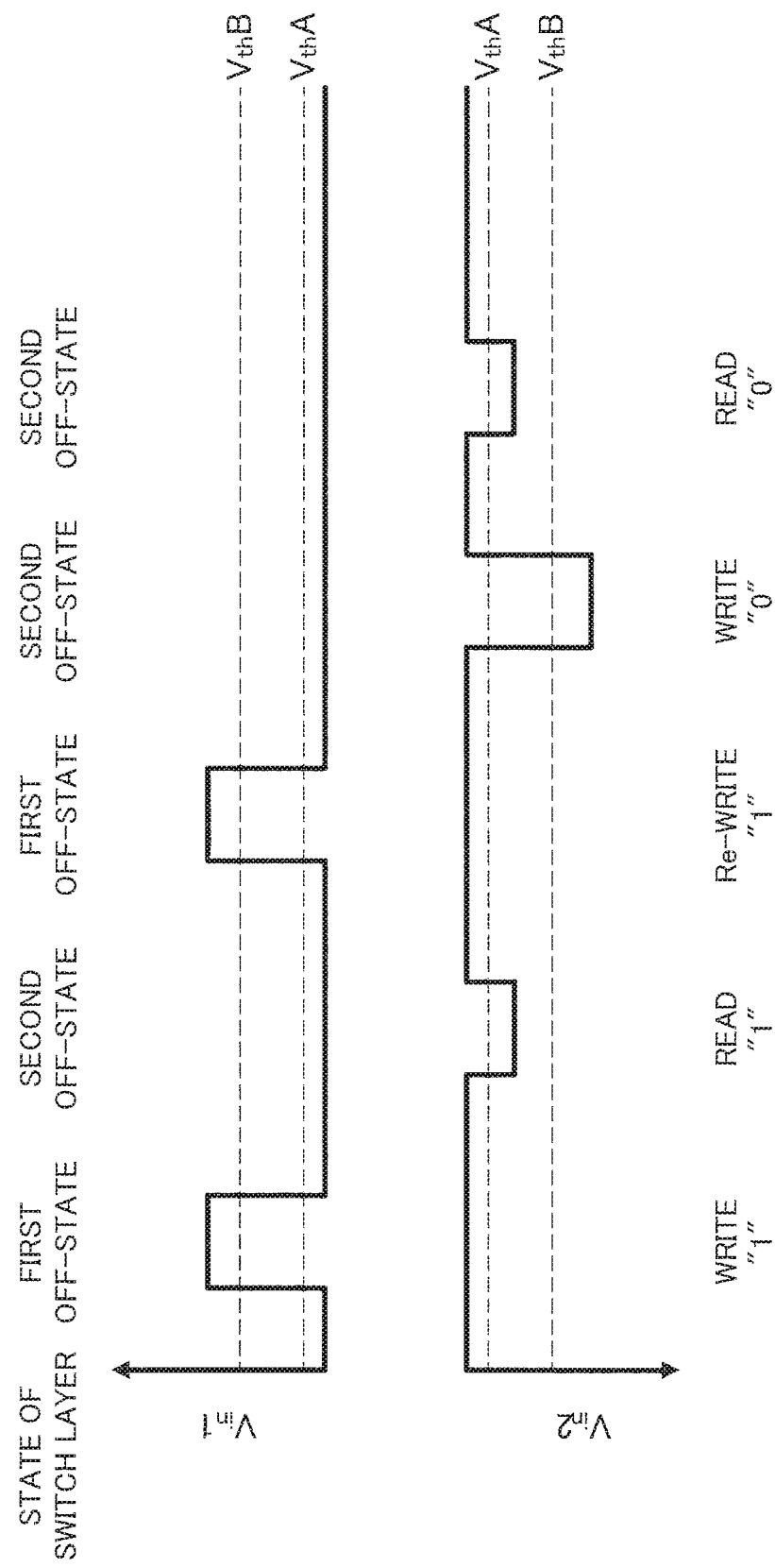
FIG. 15 is a schematic diagram describing another example of a voltage pulse applied to the circuit element 1 in the second operation method.

Further, as shown in FIG. 15, the polarity of the voltage $V_{read}$ applied to the circuit element 1 when reading information (READ "1" or READ "2") may be the same as the polarity at which the circuit element 1 is controlled to be the second off-state (for example, the second off-state in the current-voltage characteristics shown in FIG. 8) in which the switching voltage is $V_{th}B$ higher than $V_{th}A$. At this time, since there is a possibility that information stored in the circuit element 1 is overwritten by information reading, it is preferable to perform information rewriting into the circuit element 1.

Note that the magnitude of the reading voltage $V_{read}$ at this time is not particularly limited, but may be a magnitude between the switching voltage $V_{th}A$ in the "first off-state" and the switching voltage $V_{th}B$ in the "second off-state", for example.

In FIG. 15, since the reading voltage $V_{read}$ is higher than the switching voltage $V_{th}A$ in the "first off-state" in the case where the circuit element 1 is in the "first off-state" (WRITE "1"), the circuit element 1 is brought into the "on-state" by the reading voltage $V_{read}$ when reading information (READ "1"). Therefore, after information reading (READ "1"), the circuit element 1 is brought into the "second off-state". Thus, by applying a voltage higher than the switching voltage $V_{th}B$ in the "second off-state" to bring the circuit element 1 into the "on-state", information rewriting (Re-WRITE "1") into the circuit element 1 is performed.

On the other hand, since the reading voltage $V_{read}$ is lower than the switching voltage $V_{th}B$ in the "second off-state" in the case where the circuit element 1 is in the "second off-state" (WRITE "0"), the circuit element 1 is not brought into the "on-state" by the reading voltage $V_{read}$ when reading information (READ "0"). Consequently, information stored in the circuit element 1 is held even in the case where information reading is performed.

Consequently, in the case where the circuit element 1 is brought into the "on-state" when information reading is performed, and there is a possibility that information stored in the circuit element 1 has been overwritten, information rewriting into the circuit element 1 may be performed on the basis of the information having been read. With such an operation, the circuit element 1 can improve the reliability of stored information.

Note that, in a way similar to the first operation method, when using the second operation method, the detection circuit 7 may determine whether the "off-state" of the circuit element 1 is either the "first off-state" or the "second off-state" by detecting the switching voltage $V_{th}$. Before the current flowing into the circuit element 1 reaches the differential negative resistance region, the "off-state" of the circuit element 1 does not change. Therefore, the storage device 2 sets the restriction current $I_{comp}$ such that a voltage applied to the circuit element 1 slightly exceeds the switching voltage $V_{th}$, and the detection circuit 7 may determine the "off-state" of the circuit element 1 by measuring the magnitude of the switching voltage $V_{th}$. In the case where the switching voltage $V_{th}$ is used for the determination about the "off-state" of the circuit element 1, the detection circuit 7 can determine the "off-state" of the circuit element 1 more easily since the switching voltage $V_{th}$ is larger than the leak current $I_{leak}$ in the absolute value of the detection value.

4.3. Variation

Figure 16:
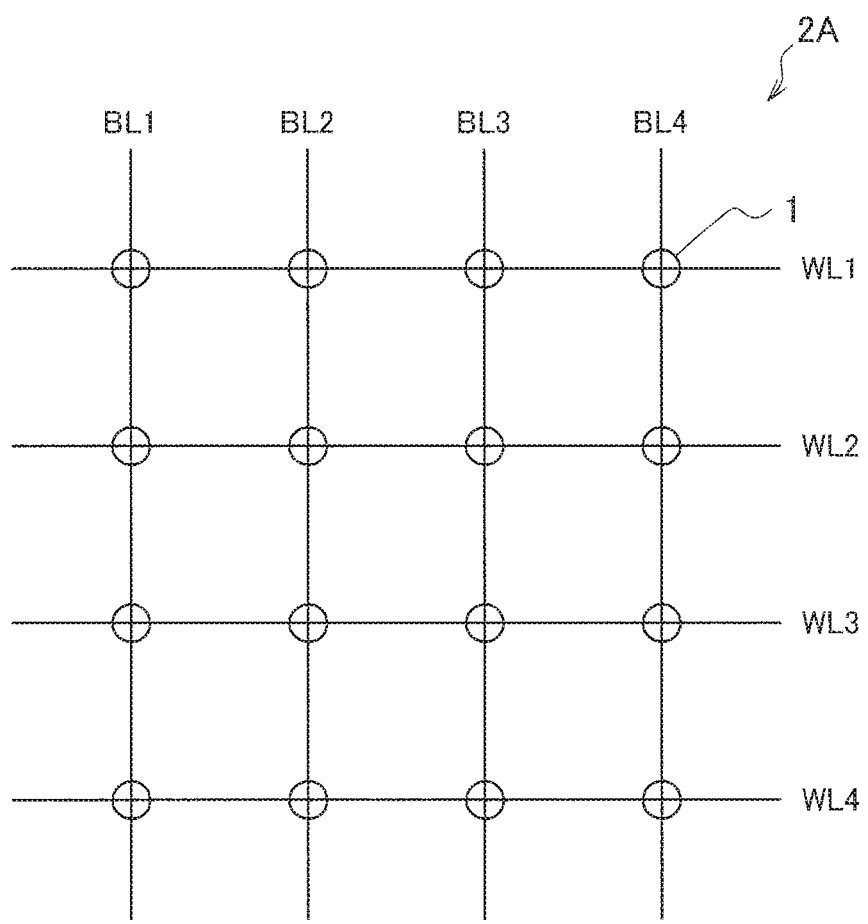
FIG. 16 is a schematic diagram describing a variation of a writing circuit of the circuit element 1 in the second operation method.

Further, a variation of a circuit for writing into the circuit element 1 according to the second operation method will be described with reference to FIG. 16. FIG. 16 is a schematic diagram describing a variation of a circuit for writing into the circuit element 1 in the second operation method.

As shown in FIG. 16, in the storage device 2A, the circuit elements 1, each of which functions as a storage element and a selection element, are provided at the intersection points of bit lines (BL1, BL2, BL3, BL4) and word lines (WL1, WL2, WL3, WL4). In addition, in a storage device 2A, a current limiting circuit that restricts a current flowing into the circuit element 1 is not provided. In the second operation method, the "first off-state" and the "second off-state" of the circuit element 1 are controlled in accordance with the polarity of a voltage applied to the circuit element 1, it may be possible not to provide a current limiting circuit that restricts a current flowing into the circuit element 1.

In such a case, however, since the current flowing into the circuit element 1 cannot be controlled, reading of information from the circuit element 1 is performed by detecting the switching voltage $V_{th}$ of the circuit element 1 rather than detecting a leak current. Specifically, the storage device 2 can determine the "off-state" of the circuit element 1 by measuring the magnitude of the switching voltage $V_{th}$ using a detection circuit or the like.

5. Conclusion

As described above, since the circuit element 1 according to an embodiment of the present disclosure functions as a storage element and a selection element with the single-layer switch layer 10, a memory cell which is a unit element that stores data can be configured in a simpler and miniaturized structure.

Specifically, the circuit element 1 according to the present embodiment can store information by functioning as a storage element, and suppress a sneak current flowing into an unselected circuit element by functioning as a selection element. Consequently, the circuit element 1 according to the present embodiment can form a memory cell which is a unit element that stores data without providing another storage element or selection element. With the circuit element 1 according to the present embodiment, a memory cell array (that is, a storage device) further increased in capacity can be formed by improving the integration density of memory cells.

Note that, according to the present disclosure, it is also possible to provide electronic equipment including any of the circuit element 1 or the storage device 2 according to the present embodiment. As such electronic equipment, various display devices such as a personal computer, a liquid crystal display device, and an organic electroluminescence display device, a mobile phone, a smartphone, a game console, Internet of Things (IoT) equipment, and the like can be illustrated, for example.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
A circuit element including:
paired inert electrodes; and
a switch layer provided between the paired inert electrodes, configured to function as a selection element and a storage element as a single layer, and having a differential negative resistance region in a current-voltage characteristic.

(2)
The circuit element according to (1), in which
the switch layer contains at least one or more kinds of chalcogen elements selected from the group consisting of Te, Se, and S.

(3)
The circuit element according to (2), in which
the switch layer further contains at least one or more kinds of first additional elements selected from the group consisting of B, Al, Ga, C, Ge, and Si.

(4)
The circuit element according to (3), in which
the switch layer further contains at least one or more kinds of second additional elements selected from the group consisting of O and N.

(5)
The circuit element according to any one of (1) to (4), in which
the inert electrodes contain at least one kind element of selected from the group consisting of Ti, W, Ta, and Si.

(6)
The circuit element according to any one of (1) to (5), in which
the switch layer has a film thickness of more than or equal to 5 nm and less than or equal to 100 nm.

(7)
The circuit element according to any one of (1) to (6), in which
another selection element or storage element is not connected to the switch layer directly or via the inert electrodes.

(8)
The circuit element according to any one of (1) to (7), in which
another electrode is not provided between the paired inert electrodes.

(9)
The circuit element according to any one of (1) to (8), further including:
a bit line and a word line configured to sandwich the paired inert electrodes and the switch layer, the bit line and the word line intersecting with each other.

(10)
The circuit element according to any one of (1) to (9), in which
at least any of materials, shapes, or interface states with the switch layer of the respective paired inert electrodes are not identical to each other.

(11)
The circuit element according to (10), in which
contact resistances of the respective paired inert electrodes with the switch layer are not identical to each other.

(12)
A storage device including:
a plurality of circuit elements arranged in a matrix, each of the plurality of circuit elements including
paired inert electrodes, and
a switch layer provided between the paired inert electrodes, configured to function as a selection element and a storage element as a single layer, and having a differential negative resistance region in a current-voltage characteristic.

(13)
The storage device according to (12), in which
the switch layers are provided continuously without being spaced apart from one another among the plurality of circuit elements.

(14)
Electronic equipment including:
a circuit element including
paired inert electrodes, and
a switch layer provided between the paired inert electrodes, configured to function as a selection element and a storage element as a single layer, and having a differential negative resistance region in a current-voltage characteristic.

(15)
A method of writing information into a circuit element, the method including:
applying a voltage of more than or equal to a threshold value to the circuit element to change the circuit element to an on-state; and
controlling a peak current value flowing into the circuit element in the on-state and controlling a resistance value of the circuit element in an off-state to any of a plurality of states to write information into the circuit element,
in which the circuit element includes
paired inert electrodes, and
a switch layer provided between the paired inert electrodes, configured to function as a selection element and a storage element as a single layer, and having a differential negative resistance region in a current-voltage characteristic.

(16)
A method of writing information into a circuit element, the method including:
applying a voltage of more than or equal to a threshold value to the circuit element to change the circuit element to an on-state; and
controlling a polarity of the voltage applied to the circuit element in the on-state and controlling a resistance value of the circuit element in an off-state to any of a plurality of states to write information into the circuit element,
in which the circuit element includes
paired inert electrodes, and
a switch layer provided between the paired inert electrodes, configured to function as a selection element and a storage element as a single layer, and having a differential negative resistance region in a current-voltage characteristic.

(17)
A method of reading information from a circuit element, the method including:
measuring a leak current in the circuit element in an off-state or a threshold voltage that changes the circuit element to an on-state; and
determining in which of a plurality of states a resistance value of the circuit element in the off-state is on a basis of the measured leak current or the measured threshold voltage to read information from the circuit element,
in which the circuit element includes
paired inert electrodes, and
a switch layer provided between the paired inert electrodes, configured to function as a selection element and a storage element as a single layer, and having a differential negative resistance region in a current-voltage characteristic.

(18)
The method of reading information from a circuit element according to (17), in which
states of the resistance value of the circuit element in the off-state are two states including a first off-state and a second off-state in which the resistance value is higher than in the first off-state,
a state of the resistance value of the circuit element in the off-state is controlled in accordance with a polarity of a voltage applied to the circuit element in the on-state, and
it is determined whether the resistance value of the circuit element in the off-state is in the first off-state or the second off-state to read information from the circuit element, on a basis of a current value flowing when applying a voltage higher than a first threshold voltage that causes the circuit element to transition from the first off-state to the on-state and lower than a second threshold voltage that causes the circuit element to transition from the second off-state to the on-state to the circuit element at a polarity which is same as a polarity of a voltage that performs control such that the resistance value of the circuit element in the off-state enters the first off-state.

(19)
The method of reading information from a circuit element according to (17) or (18), further including:
rewriting information read from the circuit element into the circuit element after reading the information from the circuit element.

REFERENCE SIGNS LIST 1 circuit element
2 storage device
3 field effect transistor
5 power supply
7 detection circuit
10 switch layer
21, 22 inert electrode
31 word line
32 bit line

The invention claimed is:
1. A circuit element, comprising:
paired inert electrodes; and
a switch layer between the paired inert electrodes, wherein
the switch layer is configured to function as a first selection element and a first storage element as a single layer,
the switch layer comprises a differential negative resistance region in a current-voltage characteristic, and
the circuit element is configured to change from an on-state to an off-state based on at least one of a voltage pulse or a current pulse applied to the circuit element, wherein
the off-state includes a first off-state and a second off-state based on the at least one of the voltage pulse or the current pulse applied to the circuit element in the on-state.

2. The circuit element according to claim 1, wherein the switch layer further comprises at least one kind of chalcogen element selected from the group consisting of Te, Se, and S.

3. The circuit element according to claim 2, wherein
the switch layer further comprises at least one kind of first additional element selected from the group consisting of B, Al, Ga, C, Ge, and Si.

4. The circuit element according to claim 3, wherein
the switch layer further comprises at least one kind of second additional element selected from the group consisting of O and N.

5. The circuit element according to claim 1, wherein
the paired inert electrodes comprises at least one kind element of selected from the group consisting of Ti, W, Ta, and Si.

6. The circuit element according to claim 1, wherein the switch layer has a film thickness of more than or equal to 5 nm and less than or equal to 100 nm.

7. The circuit element according to claim 1, wherein the switch layer is not connected to a second selection element or a second storage element directly or via the paired inert electrodes.

8. The circuit element according to claim 1, wherein an electrode other than the switch layer is not provided between the paired inert electrodes.

9. The circuit element according to claim 1, further comprising:
a bit line and a word line configured to sandwich the paired inert electrodes and the switch layer, wherein the bit line intersects the word line.

10. The circuit element according to claim 1, wherein the switch layer of a respective paired inert electrode comprises at least one of materials, shapes, or interface states that are different to each other.

11. The circuit element according to claim 10, wherein the switch layer of the respective paired inert electrode comprises a plurality of contact resistances that are different to each other.

12. A storage device, comprising:
a plurality of circuit elements arranged in a matrix, wherein each of the plurality of circuit elements includes:
   paired inert electrodes; and
   a switch layer of a plurality of switch layers between the paired inert electrodes, wherein
      the switch layer is configured to function as a selection element and a storage element as a single layer,
      the switch layer comprises a differential negative resistance region in a current-voltage characteristic, and
      a circuit element of the plurality of circuit elements is configured to change from an on-state to an off-state based on at least one of a voltage pulse or a current pulse applied to the circuit element, wherein
         the off-state includes a first off-state and a second off-state based on the at least one of the voltage pulse or the current pulse applied to the circuit element in the on-state.

13. The storage device according to claim 12, wherein the plurality of switch layers are in continuous without spaced apart from each other among the plurality of circuit elements.

14. Electronic equipment, comprising:
a circuit element that includes:
   paired inert electrodes; and
   a switch layer between the paired inert electrodes, wherein
      the switch layer is configured to function as a selection element and a storage element as a single layer,
      the switch layer comprises a differential negative resistance region in a current-voltage characteristic, and
      the circuit element is configured to change from an on-state to an off-state based on at least one of a voltage pulse or a current pulse applied to the circuit element, wherein
         the off-state includes a first off-state and a second off-state based on the at least one of the voltage pulse or the current pulse applied to the circuit element in the on-state.

15. A method, comprising:
measuring at least one of a leak current in a circuit element in an off-state or a threshold voltage that changes the circuit element to an on-state; and
determining one of a plurality of states of a resistance value of the circuit element in the off-state based on the at least one of the measured leak current or the measured threshold voltage to read information from the circuit element, wherein
   the plurality of states of the resistance value of the circuit element in the off-state are two states including a first off-state and a second off-state based on at least one of a voltage pulse or a current pulse applied to the circuit element in the on-state, and
   the circuit element includes:
      paired inert electrodes and
      a switch layer between the paired inert electrodes, wherein
         the switch layer is configured to function as a selection element and a storage element as a single layer, and
         the switch layer comprises a differential negative resistance region in a current-voltage characteristic.

16. The method according to claim 15, comprising:
controlling the plurality of states of the resistance value of the circuit element in the off-state based on a polarity of a voltage applied to the circuit element in the on-state, wherein the resistance value of the circuit element in the second off-state is higher than the resistance value of the circuit element in the first off-state; and
determining whether the resistance value of the circuit element in the off-state is in the first off-state or the second off-state to read the information from the circuit element, based on a current value, wherein
   the current value is the current pulse that flows based on an application of the voltage to the circuit element that is higher than a first threshold voltage and lower than a second threshold voltage,
   the first threshold voltage causes the circuit element to transition from the first off-state to the on-state,
   the second threshold voltage causes the circuit element to the transition from the second off-state to the on-state, and
   the voltage is applied at the polarity same as the polarity of a second voltage that performs control such that the resistance value of the circuit element in the off-state enters the first off-state.

17. The method according to claim 15, further comprising:
rewriting the information read from the circuit element into the circuit element after reading the information from the circuit element.

* * * * *